(12) United States Patent
Sharangpani et al.

(10) Patent No.: US 9,230,983 B1
(45) Date of Patent: Jan. 5, 2016

(54) METAL WORD LINES FOR THREE DIMENSIONAL MEMORY DEVICES

(71) Applicant: SANDISK TECHNOLOGIES INC., Plano, TX (US)

(72) Inventors: Rahul Sharangpani, Fremont, CA (US); Raghuveer S. Makala, Campbell, CA (US); George Matamis, Danville, CA (US)

(73) Assignee: SANDISK TECHNOLOGIES INC., Plano, TX (US)

( * ) Notice: Subject to any disclaimer, the term of this patent is extended or adjusted under 35 U.S.C. 154(b) by 0 days.

(21) Appl. No.: 14/464,480

(22) Filed: Aug. 20, 2014

(51) Int. Cl.
*G11C 11/34* (2006.01)
*H01L 27/115* (2006.01)
*H01L 21/311* (2006.01)
*H01L 21/285* (2006.01)
(Continued)

(52) U.S. Cl.
CPC ...... *H01L 27/11582* (2013.01); *G11C 16/0483* (2013.01); *G11C 16/06* (2013.01); *H01L 21/0217* (2013.01); *H01L 21/02164* (2013.01); *H01L 21/28088* (2013.01); *H01L 21/28273* (2013.01); *H01L 21/28556* (2013.01); *H01L 21/28568* (2013.01); *H01L 21/31111* (2013.01); *H01L 21/32055* (2013.01); *H01L 27/11519* (2013.01); *H01L 27/11556* (2013.01); *H01L 27/11565* (2013.01); *H01L 29/42328* (2013.01); *H01L 29/42344* (2013.01); *H01L 29/7883* (2013.01); *H01L 29/7923* (2013.01); *H01L 27/11524* (2013.01)

(58) Field of Classification Search
CPC ............... H01L 27/11524; H01L 21/31116; H01L 21/31138; H01L 21/76802; H01L 29/7827; H01L 29/7831

USPC ............ 365/185.17, 185.05, 185.06, 185.11, 365/185.33
See application file for complete search history.

(56) References Cited

U.S. PATENT DOCUMENTS

| | | |
|---|---|---|
| 5,084,417 A | 1/1992 | Joshi et al. |
| 5,807,788 A | 9/1998 | Brodsky et al. |

(Continued)

FOREIGN PATENT DOCUMENTS

WO    WO02/015277 A2    2/2002

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.

(Continued)

*Primary Examiner* — Fernando Hidalgo
(74) *Attorney, Agent, or Firm* — The Marbury Lay Group PLLC

(57) ABSTRACT

A method of making a monolithic three dimensional NAND string includes forming a stack of alternating layers of a first material and a second material different from the first material over a substrate, etching the stack to form at least one opening in the stack and forming at least one charge storage region over a sidewall of the at least one opening. The method also includes forming a tunnel dielectric layer over the at least one charge storage region in the at least one opening, forming a semiconductor channel material over the tunnel dielectric layer in the at least one opening, selectively removing at least portions of the second material layers to form recesses between adjacent first material layers and forming ruthenium control gate electrodes in the recesses.

20 Claims, 17 Drawing Sheets

(51) Int. Cl.
   *H01L 21/28* (2006.01)
   *H01L 21/02* (2006.01)
   *H01L 21/3205* (2006.01)
   *H01L 29/423* (2006.01)
   *H01L 29/788* (2006.01)
   *H01L 29/792* (2006.01)
   *G11C 16/04* (2006.01)
   *G11C 16/06* (2006.01)

(56) References Cited

U.S. PATENT DOCUMENTS

| | | | |
|---|---|---|---|
| 5,915,167 | A | 6/1999 | Leedy |
| 7,177,191 | B2 | 2/2007 | Fasoli et al. |
| 7,221,588 | B2 | 5/2007 | Fasoli et al. |
| 7,233,522 | B2 | 6/2007 | Chen et al. |
| 7,514,321 | B2 | 4/2009 | Mokhlesi et al. |
| 7,575,973 | B2 | 8/2009 | Mokhlesi et al. |
| 7,691,442 | B2 | 4/2010 | Gandikota et al. |
| 7,745,265 | B2 | 6/2010 | Mokhlesi et al. |
| 7,745,312 | B2 | 6/2010 | Herner et al. |
| 7,808,038 | B2 | 10/2010 | Mokhlesi et al. |
| 7,848,145 | B2 | 12/2010 | Mokhlesi et al. |
| 7,851,851 | B2 | 12/2010 | Mokhlesi et al. |
| 8,008,710 | B2 | 8/2011 | Fukuzumi |
| 8,053,829 | B2 | 11/2011 | Kang et al. |
| 8,187,936 | B2 | 5/2012 | Alsmeier et al. |
| 8,193,054 | B2 | 6/2012 | Alsmeier |
| 8,198,672 | B2 | 6/2012 | Alsmeier |
| 8,283,228 | B2 | 10/2012 | Alsmeier |
| 8,349,681 | B2 | 1/2013 | Alsmeier et al. |
| 8,445,347 | B2 | 5/2013 | Alsmeier |
| 8,461,000 | B2 | 6/2013 | Alsmeier et al. |
| 8,580,639 | B2 | 11/2013 | Alsmeier et al. |
| 8,648,426 | B2 * | 2/2014 | Jin .................. B82Y 10/00 257/390 |
| 8,765,543 | B2 | 7/2014 | Alsmeier et al. |
| 2007/0210338 | A1 | 9/2007 | Orlowski |
| 2007/0252201 | A1 | 11/2007 | Kito et al. |
| 2010/0044778 | A1 | 2/2010 | Seol |
| 2010/0112769 | A1 | 5/2010 | Son et al. |
| 2010/0120214 | A1 | 5/2010 | Park et al. |
| 2010/0155810 | A1 | 6/2010 | Kim et al. |
| 2010/0155818 | A1 | 6/2010 | Cho |
| 2010/0181610 | A1 | 7/2010 | Kim et al. |
| 2010/0207195 | A1 | 8/2010 | Fukuzumi et al. |
| 2010/0320528 | A1 | 12/2010 | Jeong et al. |
| 2011/0076819 | A1 | 3/2011 | Kim et al. |
| 2011/0133606 | A1 | 6/2011 | Yoshida et al. |
| 2011/0266606 | A1 | 11/2011 | Park et al. |
| 2012/0001247 | A1 | 1/2012 | Alsmeier |
| 2012/0001249 | A1 | 1/2012 | Alsmeier |
| 2012/0153400 | A1 * | 6/2012 | Jin .................. B82Y 10/00 257/390 |
| 2012/0256247 | A1 | 10/2012 | Alsmeier |
| 2012/0326221 | A1 | 12/2012 | Sinha |
| 2013/0248974 | A1 | 9/2013 | Alsmeier et al. |
| 2013/0264631 | A1 | 10/2013 | Alsmeier et al. |
| 2013/0313627 | A1 | 11/2013 | Lee et al. |
| 2014/0008714 | A1 | 1/2014 | Makala et al. |
| 2014/0131787 | A1 | 5/2014 | Alsmeier |
| 2014/0175530 | A1 | 6/2014 | Chien et al. |
| 2014/0225181 | A1 | 8/2014 | Makala et al. |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) 33-36.

Tanaka et al., "Bit-Cost Scalable Technology for Low-Cost and Ultrahigh-Density Flash Memory," Toshiba Review, vol. 63, No. 2, 2008, pp. 28-31.

Masahide Kimura, "3D Cells Make Terabit NAND Flash Possible," Nikkei Electronics Asia, Sep. 17, 2009, 6pgs.

International Search Report & Written Opinion, PCT/US2011/042566, Jan. 17, 2012.

Invitation to Pay Additional Fees & Partial International Search Report, PCT/US2011/042566, Sep. 28, 2011.

Jang et al., "Memory Properties of Nickel Silicide Nanocrystal Layer for Possible Application to Nonvolatile Memory Devices," IEEE Transactions on Electron Devices, vol. 56, No. 12, Dec. 2009.

Chen et al., "Reliability Characteristics of NiSi Nanocrystals Embedded in Oxide and Nitride Layers for Nonvolatile Memory Application," Applied Physics Letters 92, 152114 (2008).

J. Ooshita, Toshiba Announces 32Gb 3D-Stacked Multi-Level NAND Flash, 3 pages, http://techon.nikkeibp.co.jp/english/NEWS_EN/20090619/171977/ Nikkei Microdevices, Tech-On, Jun. 19, 2009.

Wang et al., "Low Temperature Silicon Selective Epitaxial Growth (SEG) and Phosphorous Doping in a Reduced-Pressure Pancake Reactor", ECE Technical Reports, Paper 299 (Apr. 1, 1992).

Whang et al., "Novel 3-Dimensional Dual Control-Gate with Surrounding Floating-Gate (DC-SF) NAND Flash Cell for 1Tb File Storage Application", IEDM-2010 Proceedings, Dec. 6-8, 2010, pp. 668-671.

Lim et al., "The Effect of CF4 Addition on Ru Etching with Inductively Coupled Plasma," Journal of the Korean Physical Society, vol. 42, Feb. 2003.

Lee et al., "Reactive Ion Etching Mechanism of $RuO_2$ Thin Films in Oxygen Plasma with the Addition of $CF_4$, $Cl_2$, and $N_2$," Abstract from 1998 Jpn. J. Appl. Phys. 37 2634.

Yunogami et al., "Anisotropic Etching of RuO2 and Ru with High Aspect Ratio for Gigabit Dynamic Random Access Memory," Abstract from J. Vac. Sci. Technol. B 18, 1911 (2000).

U.S. Appl. No. 14/133,979, filed Dec. 19, 2013, SanDisk Technologies Inc.

U.S. Appl. No. 14/183,152, filed Feb. 18, 2014, SanDisk Technologies Inc.

U.S. Appl. No. 14/219,161, filed Mar. 19, 2014, SanDisk Technologies Inc.

U.S. Appl. No. 14/225,116, filed Mar. 25, 2014, SanDisk Technologies Inc.

U.S. Appl. No. 14/225,176, filed Mar. 25, 2014, SanDisk Technologies Inc.

U.S. Appl. No. 14/264,262, filed Apr. 29, 2014, SanDisk Technologies Inc.

U.S. Appl. No. 14/264,312, filed Apr. 29, 2014, SanDisk Technologies Inc.

U.S. Appl. No. 14/264,407, filed Apr. 29, 2014, SanDisk Technologies Inc.

U.S. Appl. No. 14/282,567, filed May 20, 2014, SanDisk Technologies Inc.

U.S. Appl. No. 14/314,370, filed Jun. 25, 2014, SanDisk Technologies Inc.

Han et al., "Growth of RuO2 Thin Films by Pulsed-Chemical Vapor Deposition Using RuO4 Precursor and 5% H2 Reduction Gas," Chem. Mater. 2010, 22, pp. 5700-5706.

PCT Application No. PCT/US2015/043729, Invitation to Pay Additional Fees, issued Nov. 2, 2015, 7pgs.

* cited by examiner

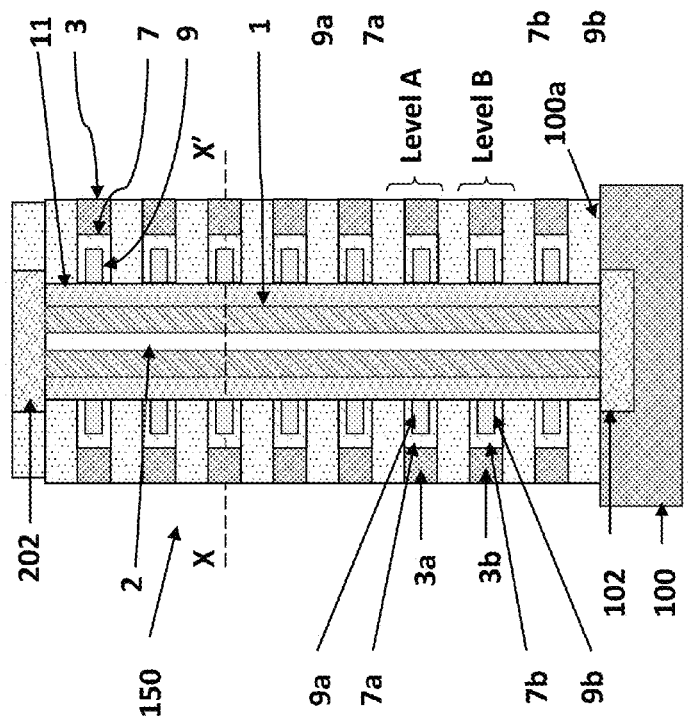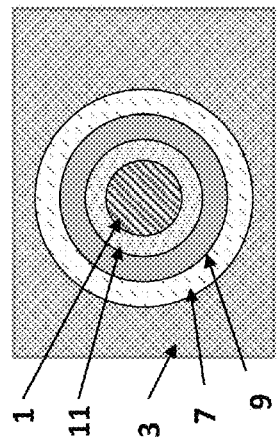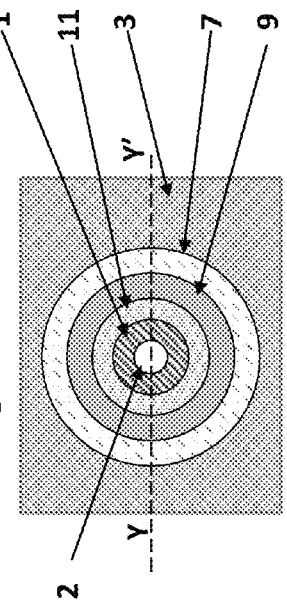

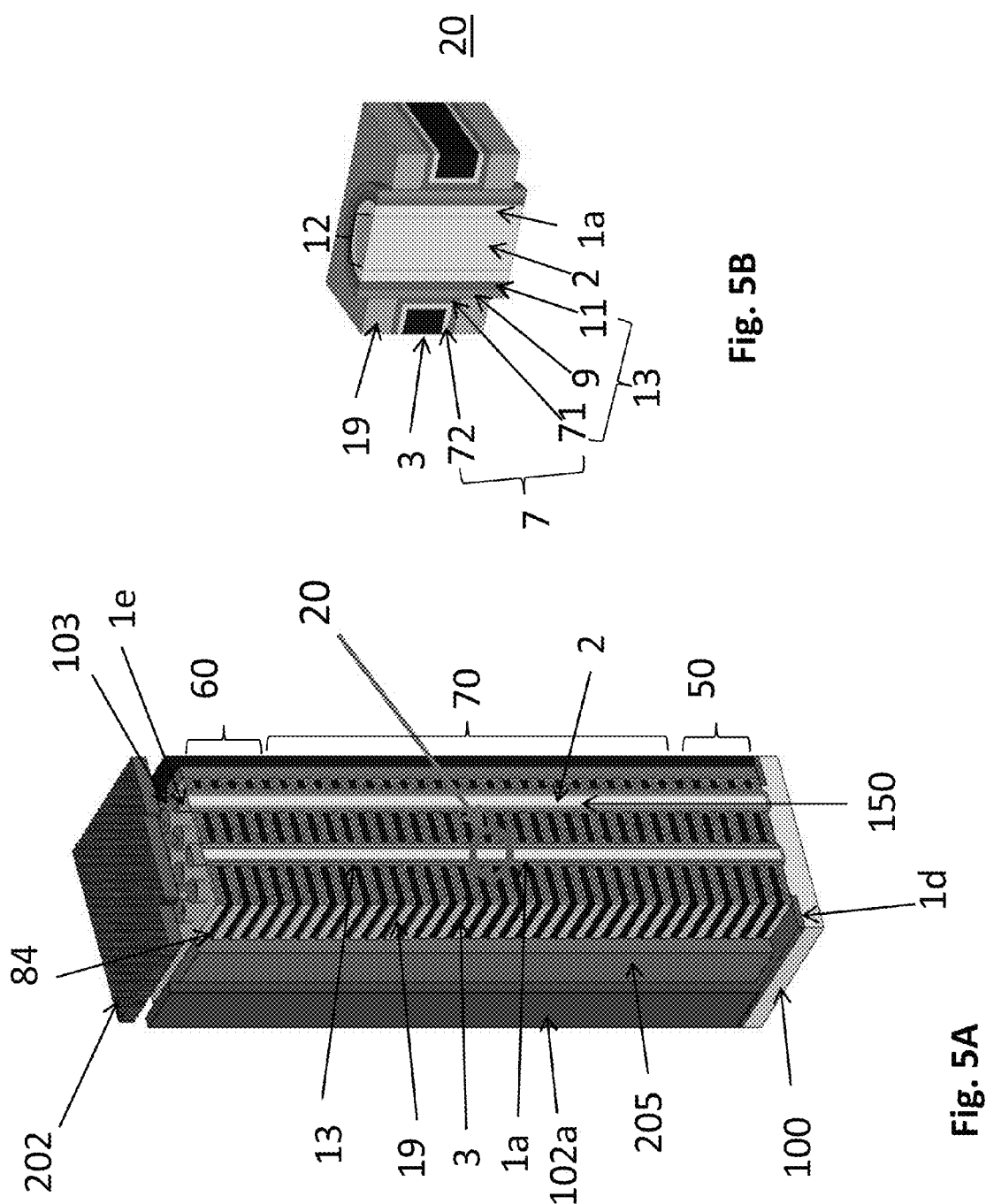

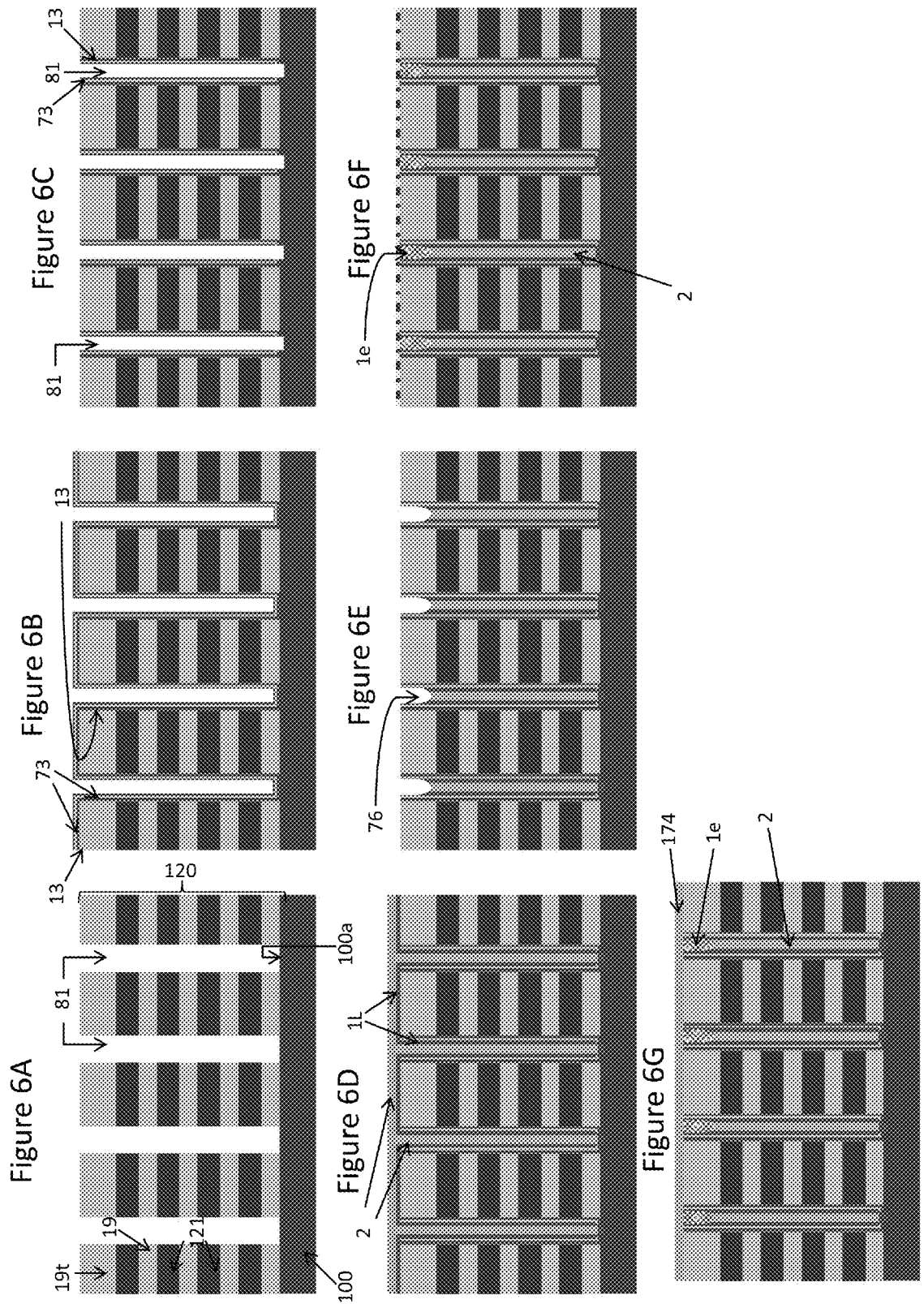

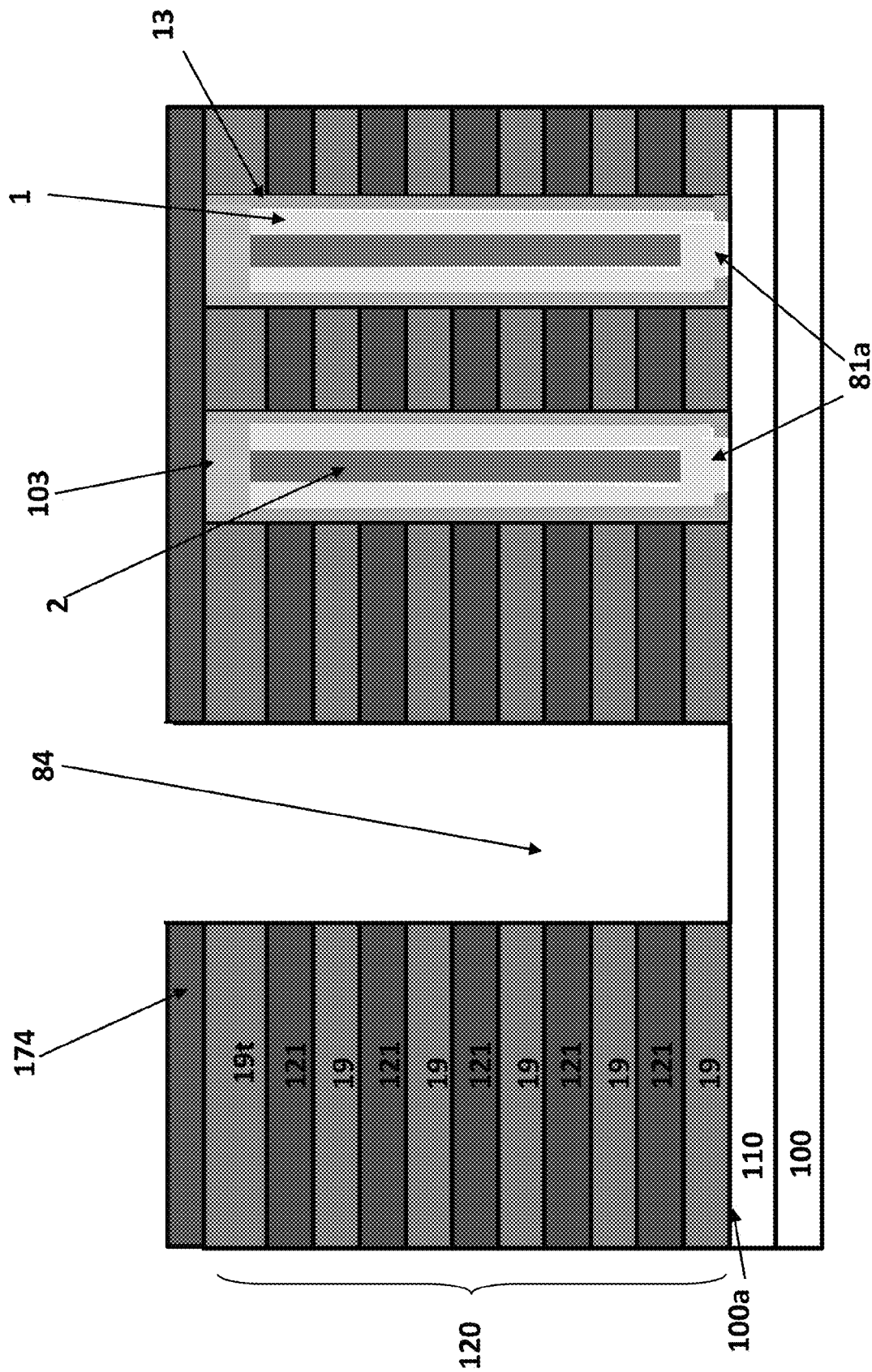

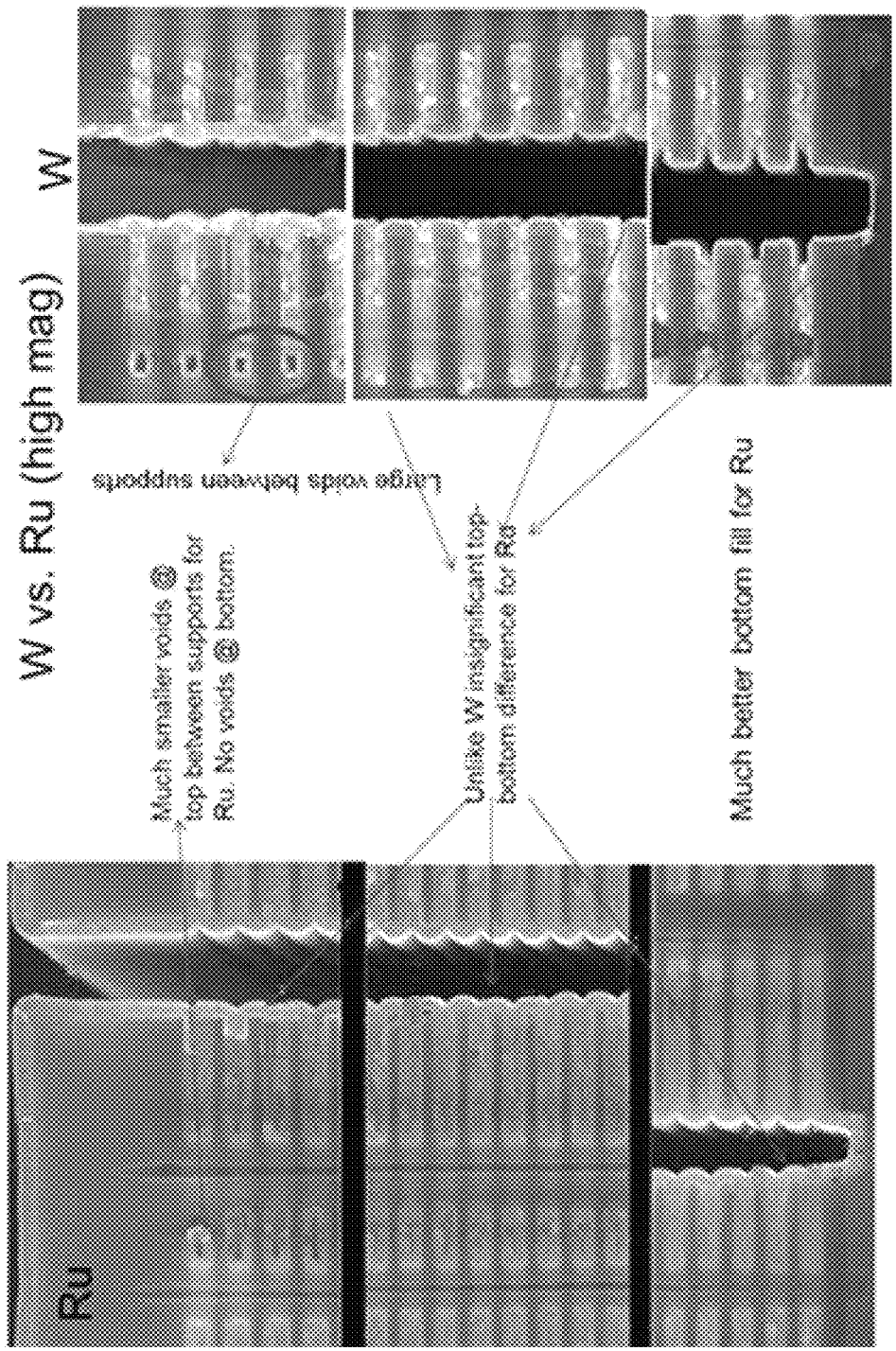

METAL WORD LINES FOR THREE DIMENSIONAL MEMORY DEVICES

FIELD

The present disclosure relates generally to the field of semiconductor devices and specifically to three dimensional vertical NAND strings and other three dimensional devices and methods of making thereof.

BACKGROUND

Three dimensional vertical NAND strings are disclosed in an article by T. Endoh, et. al., titled "Novel Ultra High Density Memory With A Stacked-Surrounding Gate Transistor (S-SGT) Structured Cell", IEDM Proc. (2001) 33-36.

SUMMARY

An embodiment relates to a method of making a monolithic three dimensional NAND string including forming a stack of alternating layers of a first material and a second material different from the first material over a substrate, etching the stack to form at least one opening in the stack and forming at least one charge storage region over a sidewall of the at least one opening. The method also includes forming a tunnel dielectric layer over the at least one charge storage region in the at least one opening, forming a semiconductor channel material over the tunnel dielectric layer in the at least one opening, selectively removing at least portions of the second material layers to form recesses between adjacent first material layers and forming ruthenium control gate electrodes in the recesses.

Another embodiment relates to a monolithic three dimensional NAND string including a semiconductor channel having at least one end portion of the semiconductor channel extending substantially perpendicular to a major surface of a substrate and a plurality of ruthenium control gate electrodes extending substantially parallel to the major surface of the substrate. The plurality of control gate electrodes comprise at least a first control gate electrode located in a first device level and a second control gate electrode located in a second device level located over the major surface of the substrate and below the first device level. The NAND string also includes a blocking dielectric located in contact with the plurality of ruthenium control gate electrodes, at least one charge storage region located in contact with the blocking dielectric and a tunnel dielectric located between the at least one charge storage region and the semiconductor channel. The NAND string also includes a source region located in or over the substrate and a ruthenium source line in contact with the source region.

BRIEF DESCRIPTION OF THE DRAWINGS

FIGS. 1A and 1B are respectively side cross sectional and top cross sectional views of a NAND string according to one embodiment. FIG. 1A is a side cross sectional view of the device along line Y-Y' in FIG. 1B, while FIG. 1B is a side cross sectional view of the device along line X-X' in FIG. 1A. FIG. 1C is a top cross sectional view of a NAND string according to an alternative embodiment.

FIG. 4B is a side cross sectional view of the device along line B-B' in FIG. 4A, while FIG. 4C is a side cross sectional view of the device along line W-W' in FIG. 4A.

FIG. 5A is a cut-away, three dimensional perspective of the device of FIGS. 4A-4C, but with the optional lower semiconductor pillar omitted. FIG. 5B is a close up, cross sectional view of one memory cell of FIG. 5A.

FIGS. 6A-6G illustrate a method of making NAND strings according to an embodiment.

FIGS. 7 to 14 illustrate a method of forming metal replacement gates in the NAND strings of the previous embodiments.

FIGS. 17A and 17B are scanning electron micrographs comparing microstructure of ALD grown ruthenium control gate electrodes with ICE grown tungsten control gate electrodes.

DETAILED DESCRIPTION

Figure 2:
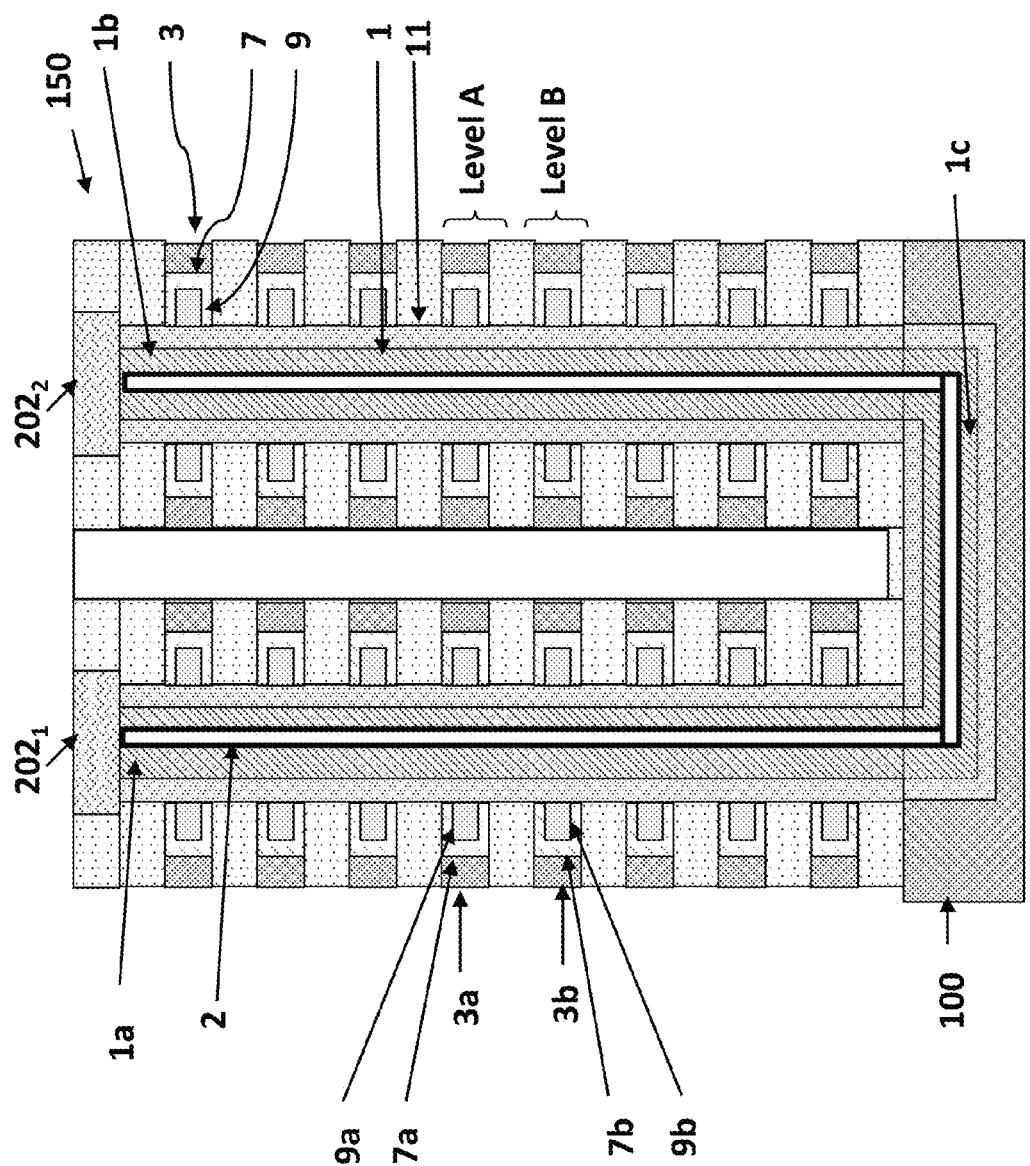
FIG. 2 is a side cross sectional view of a NAND string of another embodiment with a U-shaped channel.

The present inventors have realized that by making the control gates and/or the source lines of three dimensional NAND string memory devices of ruthenium is unexpectedly advantageous over conventional tungsten control gates and word lines. Ruthenium has a bulk resistivity that is 40% greater than the bulk resistivity of tungsten and has therefore only been used for floating gates or hybrid charge storage regions. See, for example, U.S. patent application Ser. No. 13/083,775, filed Apr. 11, 2011, now U.S. Pat. No. 8,445,347 and U.S. patent application Ser. No. 14/314,370, filed Jun. 25, 2014, which disclose three dimensional NAND strings with ruthenium floating gates and are hereby incorporated in their entirety.

Although ruthenium has a greater bulk resistivity than tungsten, additional adhesion and nucleation layer(s) are typically added to improve tungsten deposition. The adhesion layer is typically TiN, which has a higher resistivity than both tungsten and ruthenium. The inventors have realized that when the thickness and the resistivity of the adhesion layer are taken into account, control gates and source lines having lower overall resistance can be fabricated from ruthenium relative to control gates and source lines made of tungsten plus TiN. Further, to get a good tungsten fill, the adhesion layer and the nucleation layer should be uniform. Any non-uniformity in these layers would persist in the following tungsten layer. Additionally, the inventors have realized that for thin films (about 30 nm or less), the resistivity of ruthenium and tungsten are about same. Thus, for thin control gate electrodes, use of ruthenium is further advantageous over tungsten.

Additionally, a byproduct of the tungsten CVD process is HF. This HF can attack exposed oxides in the NAND string. In contrast, atomic layer deposition (ALD) of ruthenium does not produce a HF byproduct. In the ALD ruthenium deposition process, a $RuO_4$ precursor is used to deposit one or more $RuO_2$ monolayers. Then the one or more $RuO_2$ monolayers are exposed to a reducing atmosphere to reduce the deposited one or more $RuO_2$ monolayers to one or more Ru monolayers. These steps are then repeated until the desired thickness of ruthenium is formed. In an embodiment, the ALD process optionally further includes annealing the ruthenium layer using rapid thermal annealing at a temperature between 900 and 1000 C.

Further, tungsten has a high bulk modulus which generates high tensile stress in NAND string and may lead to warping of the substrate. In contrast, ruthenium is softer than tungsten and has a lower bulk modulus. Thus, the use of ruthenium generates less stress on the NAND string, thereby reducing or eliminating warpage of the substrate (e.g., silicon wafer).

Additionally, the work function of ruthenium is about the same as tungsten (both about 4.7 eV). The work function is a material property of the word line metal and controls several key electrical parameters of the memory. As a result of being the same, there is no penalty in using ruthenium versus tungsten for the properties controlled by the work function.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

Figure 3:
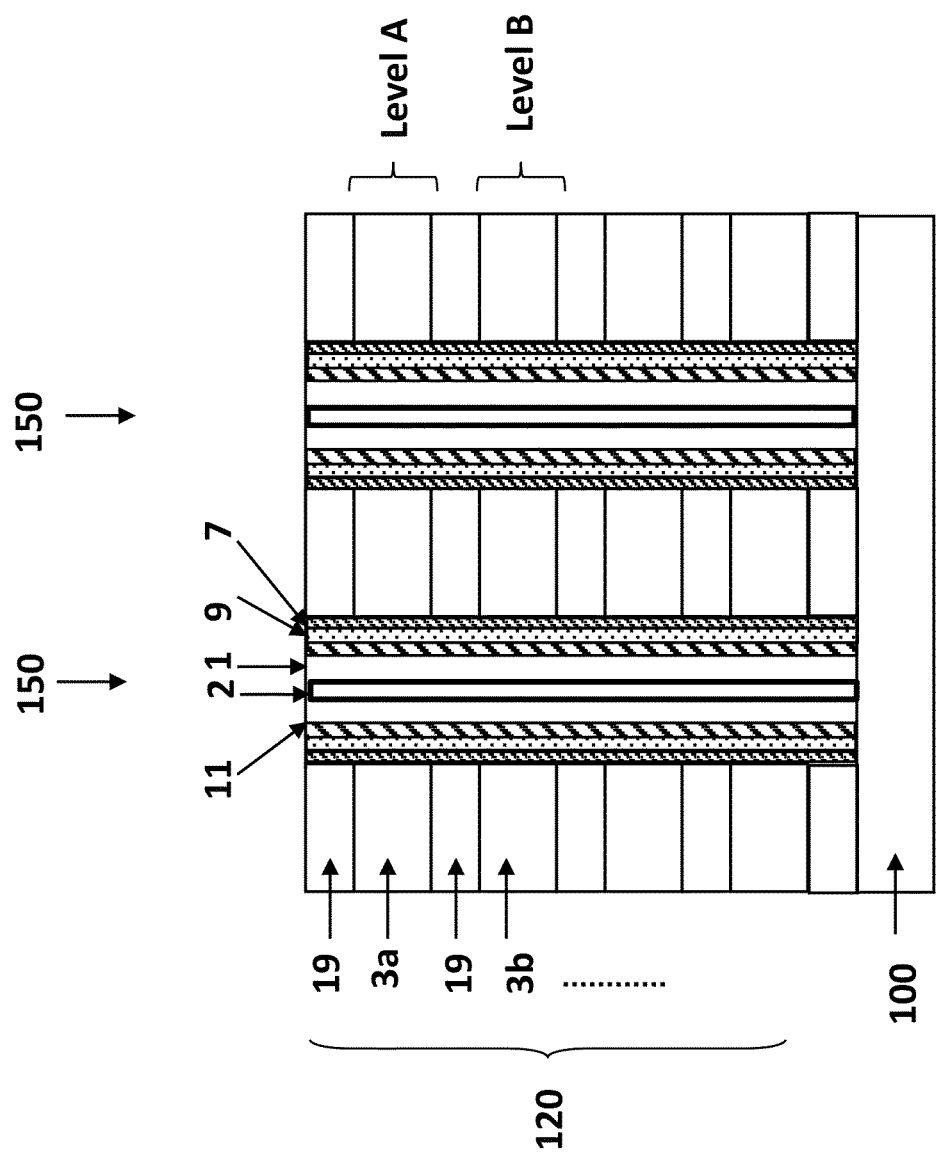
FIG. 3 is a side cross sectional view of another embodiment NAND string.

In some embodiments, the monolithic three dimensional NAND string 150 comprises a semiconductor channel 1 having at least one end portion extending substantially perpendicular to a major surface 100a of a substrate 100, as shown in FIGS. 1A, 2, 3, 4B and 4C. "Substantially perpendicular to" (or "substantially parallel to") means within 0-10°. For example, the semiconductor channel 1 may have a pillar shape and the entire pillar-shaped semiconductor channel extends substantially perpendicularly to the major surface of the substrate 100, as shown in FIGS. 1A and 3. In these embodiments, the source/drain electrodes of the device can include a lower electrode 102 provided below the semiconductor channel 1 and an upper electrode 202 formed over the semiconductor channel 1, as shown in FIG. 1A.

Figure 4C:
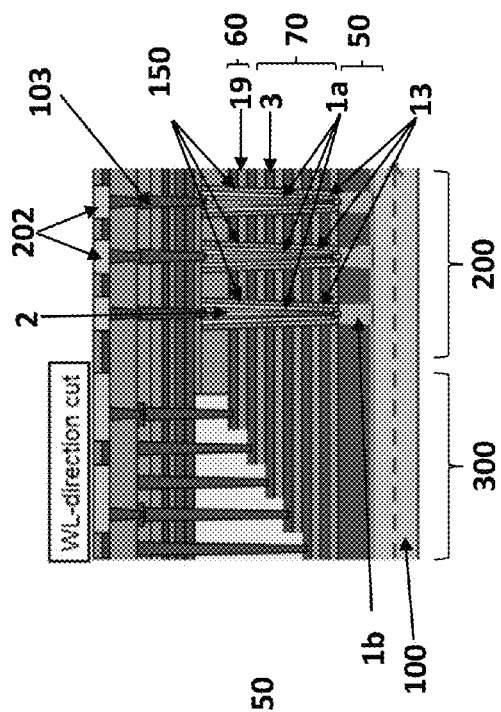
FIGS. 4B and 4C are side cross sectional views of the memory block of FIG. 4A along the bit line and word line directions, respectively.

Alternatively, the semiconductor channel 1 may have a U-shaped pipe shape, as shown in FIG. 2. The two wing portions 1a and 1b of the U-shaped pipe shape semiconductor channel may extend substantially perpendicular to the major surface 100a of the substrate 100, and a connecting portion 1c of the U-shaped pipe shape semiconductor channel 1 connects the two wing portions 1a, 1b extends substantially parallel to the major surface 100a of the substrate 100. In these embodiments, one of the source or drain electrodes $202_1$ contacts the first wing portion of the semiconductor channel from above, and another one of a source or drain electrodes $202_2$ contacts the second wing portion of the semiconductor channel 1 from above. An optional body contact electrode (not shown) may be disposed in the substrate 100 to provide body contact to the connecting portion of the semiconductor channel 1 from below. The NAND string's select or access transistors are not shown in FIGS. 1A-3 for clarity. However, the source side select transistor 50 and drain side select transistor 60 are shown in FIGS. 4C and 5A. These transistors may have one select gate per side as shown in FIG. 4C or plural select gates per side as shown in FIG. 5A.

The semiconductor channel 1 may be hollow, for example a hollow cylinder, containing an insulating material 2, such as $SiO_2$ located in the middle region (e.g., core region) 12, as shown in FIG. 5B. In other words, the middle region 12 is the hollow middle part of the channel 1.

Figure 4B:
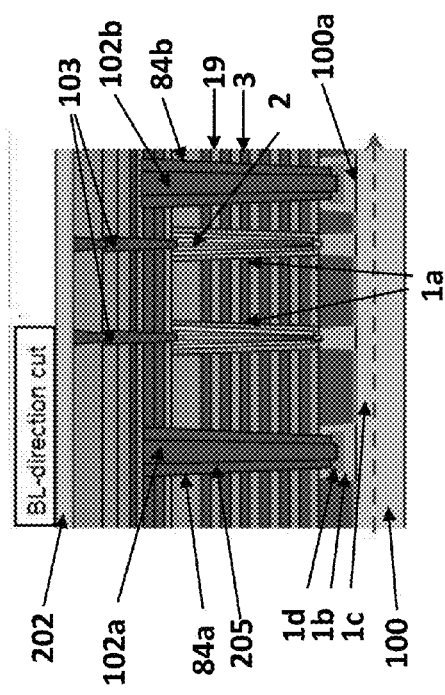
Figure 4A:
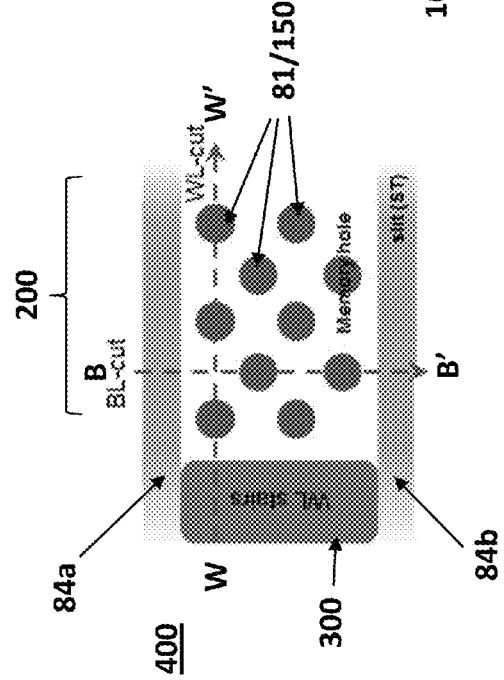
FIG. 4A is a top cross sectional view of a memory block of an embodiment.

FIGS. 4A to 4C illustrate a memory block 400 containing an array of a plurality of vertical NAND strings 150 according to another embodiment. Each string includes the memory device levels 70, respectively, as shown in FIG. 4C. FIGS. 4A and 4C show the location of memory region 200 and the stepped word line contact region 300. FIG. 5A shows a three dimensional view of the device similar to that shown in FIGS. 4A-4C, except that with the silicon pillar 1b under the source 1d and the silicon pillar 1b under channel portion 1a omitted and plural select transistors 50, 60 are located on each side of the channel in FIG. 5A. FIG. 5B shows a close up of one memory cell 20 of the device of FIG. 5A.

A first source electrode 102a is located in the first dielectric filled slit trench 84a and a second source electrode 102b is located in the second dielectric filled slit trench 84b in each block 400, as shown in FIGS. 4A, 4B and 5A. In the memory device levels 70, the dielectric fill in the slit trench 84 may comprise any suitable insulating layer 205, such as silicon oxide, etc., which is located on both walls of the slit trench 84. The source electrode 102 is located in the middle of the slit trench 84 and is separated from the ruthenium control gate electrodes 3 by the insulating layer 205, as shown in FIGS. 4B and 5A. Drain electrodes (e.g., bit lines) 202 and drain lines 103 are located over the NAND memory cell region in memory device levels 70.

As discussed above, each NAND string 150 contains a NAND memory cell region in the memory device levels 70 which includes the semiconductor channel 1 which contains a portion 1a which extends substantially perpendicular to the major surface 100a of the substrate 100. A bottom portion 1c of the channel 1 is located in or over the major surface 100a of the substrate 100, and extends toward the doped source region 1d substantially parallel to the major surface of the substrate. A drain region 1e is located in the upper part of the channel portion 1a in contact with a respective drain line 103, as shown in FIG. 5A. An optional semiconductor pillar may form an optional vertical portion 1b of the channel which extends substantially perpendicular to the major surface 100a of the substrate 100 and which contacts the source region 1d. The source region 1d may be located in the pillar above portion 1b of the channel or in the major surface 100a of the substrate.

The device contains a plurality of control gate electrodes 3 that extend substantially parallel to the major surface 100a of the substrate 100 in the memory device levels 70 from the memory region 200 to the stepped word line contact region 300. The portions of the control gate electrodes 3 which extend into region 300 may be referred to as "word lines" herein. The drain electrode (e.g., bit line) 202 electrically contacts an upper portion of the semiconductor channel 1 via drain lines 103.

Furthermore, each NAND string 150 contains at least one memory film 13 which is located adjacent to the semiconductor channel 1 (e.g., at least next to portion 1a of the channel) in the memory device levels 70, as shown in FIG. 4C. Specifically, the memory film 13 is located between the semiconductor channel 1 and the plurality of control gate electrodes 3. Each memory cell 20 includes a portion of the channel 1, a control gate electrode 3 and a portion of the memory film 13, as shown in FIGS. 5A and 5B. The memory film 13 contains the tunnel dielectric 11, the charge storage region(s) 9 (e.g., a charge trapping layer or floating gates), and the blocking dielectric 7, as shown in FIG. 5B. Each part of the memory film 13, such as the tunnel dielectric 11, the charge storage region 9, and/or the blocking layer 7 may be comprised of one or more layers (e.g., one or more dielectric layers) made of different materials. The middle region 12 is located in the middle of the channel 1 portion 1a. The charge storage region 9 may comprise a plurality of discrete floating gates or a continuous charge storage dielectric layer.

As shown in FIG. 4C, the control gate electrodes 3 extend in the word line direction W-W' which is perpendicular to the bit line direction B-B'. The control gate electrodes 3 are continuous in the array in the memory block 400. In other words, the control gate electrodes 3 have a shape of a continuous strip or sheet with discrete openings 81 (which are referred to herein as front side openings or memory openings) which contain the NAND strings 150. However, the control gate electrodes 3 have electrical and physical continuity in the bit line direction between the trenches 84 and in the word line direction throughout the block 400. In other words, the memory openings 81 do not completely sever the continuous electrical and physical path in the control gate electrodes from one trench 84 to the opposite trench 84 in each block.

The substrate 100 can be any semiconducting substrate known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as silicon oxide, glass, plastic, metal or ceramic substrate. The substrate 100 may include integrated circuits fabricated thereon, such as driver circuits for a memory device.

Any suitable semiconductor materials can be used for semiconductor channel 1, for example silicon, germanium, silicon germanium, or other compound semiconductor materials, such as III-V, II-VI, or conductive or semiconductive oxides, etc. The semiconductor material may be amorphous, polycrystalline or single crystal. The semiconductor channel material may be formed by any suitable deposition methods. For example, in one embodiment, the semiconductor channel material is deposited by low pressure chemical vapor deposition (LPCVD). In some other embodiments, the semiconductor channel material may be a recrystallized polycrystalline semiconductor material formed by recrystallizing an initially deposited amorphous semiconductor material.

The insulating fill material 2 may comprise any electrically insulating material, such as silicon oxide, silicon nitride, silicon oxynitride, or other high-k insulating materials. Alternatively, the core fill material 2 may be omitted and the channel 1 may comprise a solid silicon rod, as shown in FIG. 1C. Thus, the middle (core) region 12 is filled with the channel material in an alternative embodiment.

The monolithic three dimensional NAND string further comprise a plurality of ruthenium control gate electrodes 3, as shown in FIGS. 1A to 5B. The control gate electrodes 3 may comprise a portion having a strip shape extending substantially parallel to the major surface 100a of the substrate 100. The plurality of control gate electrodes 3 comprise ruthenium.

A blocking dielectric 7 is located adjacent to the control gate(s) 3 and may surround the control gate electrodes 3, as shown in FIGS. 1A and 2. Alternatively, a straight blocking dielectric layer 7 may be located only adjacent to an edge (i.e., minor surface) of each control gate electrode 3, as shown in FIG. 3. The blocking dielectric 7 may comprise a layer having plurality of blocking dielectric segments located in contact with a respective one of the plurality of control gate electrodes 3, for example a first blocking dielectric segment 7a located in device level A and a second blocking dielectric segment 7b located in device level B are in contact with control electrodes 3a and 3b, respectively, as shown in FIG. 2. Alternatively, the blocking dielectric 7 may be a straight, continuous layer, as shown in FIG. 3, similar to the device described in U.S. Pat. No. 8,349,681 issued on Jan. 8, 2013 and incorporated herein by reference in its entirety.

The monolithic three dimensional NAND string also comprise a charge storage region 9. The charge storage region 9 may comprise one or more continuous layers which extend the entire length of the memory cell portion of the NAND string, as shown in FIGS. 3 and 5A. For example, the charge storage region 9 may comprise an insulating charge trapping material, such as a silicon nitride layer.

Alternatively, the charge storage region may comprise a plurality of discrete charge storage regions 9, as shown in FIGS. 1A and 2. The plurality of discrete charge storage regions 9 comprise at least a first discrete charge storage region 9a located in the device level A and a second discrete charge storage region 9b located in the device level B, as shown in FIGS. 1A and 2. The discrete charge storage regions 9 may comprise a plurality of vertically spaced apart, conductive (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), or semiconductor (e.g., polysilicon) floating gates. Alternatively, the discrete charge storage regions 9 may comprise an insulating charge trapping material, such as silicon nitride segments.

The tunnel dielectric 11 of the monolithic three dimensional NAND string is located between charge storage region 9 and the semiconductor channel 1.

The blocking dielectric 7 and the tunnel dielectric 11 may be independently selected from any one or more same or different electrically insulating materials, such as silicon oxide, silicon nitride, silicon oxynitride, or other insulating materials. The blocking dielectric 7 and/or the tunnel dielectric 11 may include multiple layers of silicon oxide, silicon nitride and/or silicon oxynitride (e.g., ONO layers) and/or high-k materials such as aluminum oxide, hafnium oxide or combinations thereof. For example, the blocking dielectric 7 may comprise an inner silicon oxide layer 71 adjacent to the charge storage region 9 and an outer metal oxide layer 72 (e.g., aluminum oxide) adjacent to the ruthenium control gate 3. The blocking dielectric comprises a plurality of metal oxide clam shaped regions 72 and the plurality of ruthenium control gate electrodes 3 are located in respective openings in respective metal oxide clam shaped regions, as shown in FIG. 5B.

The blocking dielectric 7, charge storage region(s) 9 and the tunnel dielectric 11 together is also referred to herein as a memory film 13, as shown in FIGS. 4B, 4C and 5B.

In summary, at least the portion 1a of the semiconductor channel 1 comprises a hollow cylinder shaped channel surrounding the middle region 12. The tunnel dielectric 11 comprises a cylinder which surrounds the semiconductor channel 1 (e.g., at least portion 1a of channel 1). As described above, the tunnel dielectric 11 may comprise a single insulating layer or a stack of a plurality of insulating layers comprised of different materials. The at least one charge storage region 9 comprises a cylinder shaped plurality of vertically spaced apart floating gates or a cylinder shaped dielectric charge storage layer which surrounds the tunnel dielectric 11. The blocking dielectric 7 comprises a cylinder which surrounds the at least one charge storage region 9. As described above, the blocking dielectric may comprise a single insulating layer or a stack of a plurality of insulating layers comprised of different materials. The control gate electrodes 3 surround the blocking dielectric 7.

FIGS. 6A-6G illustrate a method of making a NAND string according to an embodiment. As illustrated in FIG. 6A, a stack 120 of alternating first material layers 19 and second material layers 121 is provided over a major surface 100a of a substrate 100. The first material layers 19 comprise an insulating material and the second material layers 121 comprise sacrificial layers. In an embodiment, the first material layers 19 comprise silicon oxide and the second material layers 121 comprise polysilicon, amorphous silicon, or silicon nitride.

If desired, a top insulating layer 19t may have a greater thickness and/or a different composition from the other insulating layers 19. For example, the top insulating layer 19t may comprise a cover silicon oxide layer made using a TEOS source while the remaining layers 19 may comprise thinner silicon oxide layers may using a different source. The method includes forming front side openings 81 by RIE or another suitable etching method. The stack 120 includes a plurality of front side openings 81 (e.g. a plurality of cylindrical memory holes shown in FIG. 1B).

As shown in FIG. 6B, the next step includes forming at least a portion of the memory film 13 in the front side openings 81. For example, the tunnel dielectric 11 is formed in the front side opening 81. If desired, the blocking dielectric 7 and/or the charge storage region(s) 9 portions of the memory film may also be formed in the front side openings 81 prior to forming the tunnel dielectric 11, such that the entire memory film 13 is formed in the front side openings 81, as shown in FIG. 6B. Thus, in this embodiment, the method include forming the blocking dielectric layer 7 in the front side openings 81, forming the at least one charge storage region 9 over the blocking dielectric layer 7 in the front side openings, and forming the tunnel dielectric layer 11 over the at least one charge storage region 9 in the front side openings.

Alternatively, the blocking dielectric 7 and/or the charge storage region(s) 9 may be formed from the back side through the back side opening 84 and back side recesses as shown in FIGS. 4B and 5A and as will be described in more detail below with respect to FIGS. 7-14. In an embodiment, the blocking dielectric 7 comprises a metal oxide blocking dielectric 72, as shown in FIG. 5B.

If desired, an optional cover layer 73, such as an amorphous silicon layer, is formed over the tunnel dielectric portion of the memory film 13, as shown in FIG. 6B. The cover layer 73 and the memory film 13 are then anisotropically etched to remove the cover layer 73 and the memory film 13 from the bottom portions 81a of the front side openings 81 while leaving layer 73 and film 13 on the sidewalls of the front side openings 81, as shown in FIG. 6C. This etching step exposes the upper surface of the substrate 100 in the bottom portions 81a of the front side openings 81. Layer 73 protects the tunnel dielectric portion of the memory film 13 during the etching step. If desired, layer 73 may be removed after the etching step. Alternatively, if layer 73 comprises a semiconductor material, such as silicon, then it may be retained in the device to become part of the channel.

Then, as shown in FIG. 6D, the optional insulating core layer 2 is formed over the upper portion of the stack 120 and in the front side openings 81. Layer 2 is then recessed by etch back to leave recesses 76 in the upper portions of the openings 81 over layer 2, as shown in FIG. 6E.

Then, as shown in FIG. 6F a doped semiconductor drain region 1e is formed in electrical contact with the upper portion of the semiconductor channel layer 1L. The drain region 1e may be formed by depositing a semiconductor cap layer (e.g., amorphous silicon or polysilicon cap layer) and implanting dopants (e.g., N-type dopants, such as arsenic or phosphorus). The cap layer is then planarized by etched back or CMP even with the top insulating layer in the stack to leave the drain regions 1e in contact with the upper part of the channel layer. This stage of the process is then completed by forming a cover layer 174, such as a silicon oxide cover layer using a TEOS source, over the entire device, as shown in FIG. 6G.

Then, the ruthenium control gate electrodes 3, and optionally the blocking dielectric 7 and/or the charge storage region(s) 9 may be formed by a replacement process through a back side opening 84, as shown in FIGS. 7-14.

FIG. 7 illustrates the device following the filling of the front side openings 81 and formation of the cover layer 174 as discussed above. As shown in FIG. 7, the back side opening 84 (e.g., the slit trench shown in FIGS. 4A, 4B and 5A) is then formed in the stack 120 by any suitable lithography and etching steps to expose a p-type doped well (e.g., p-well) 110 in the substrate 100.

Figure 8:
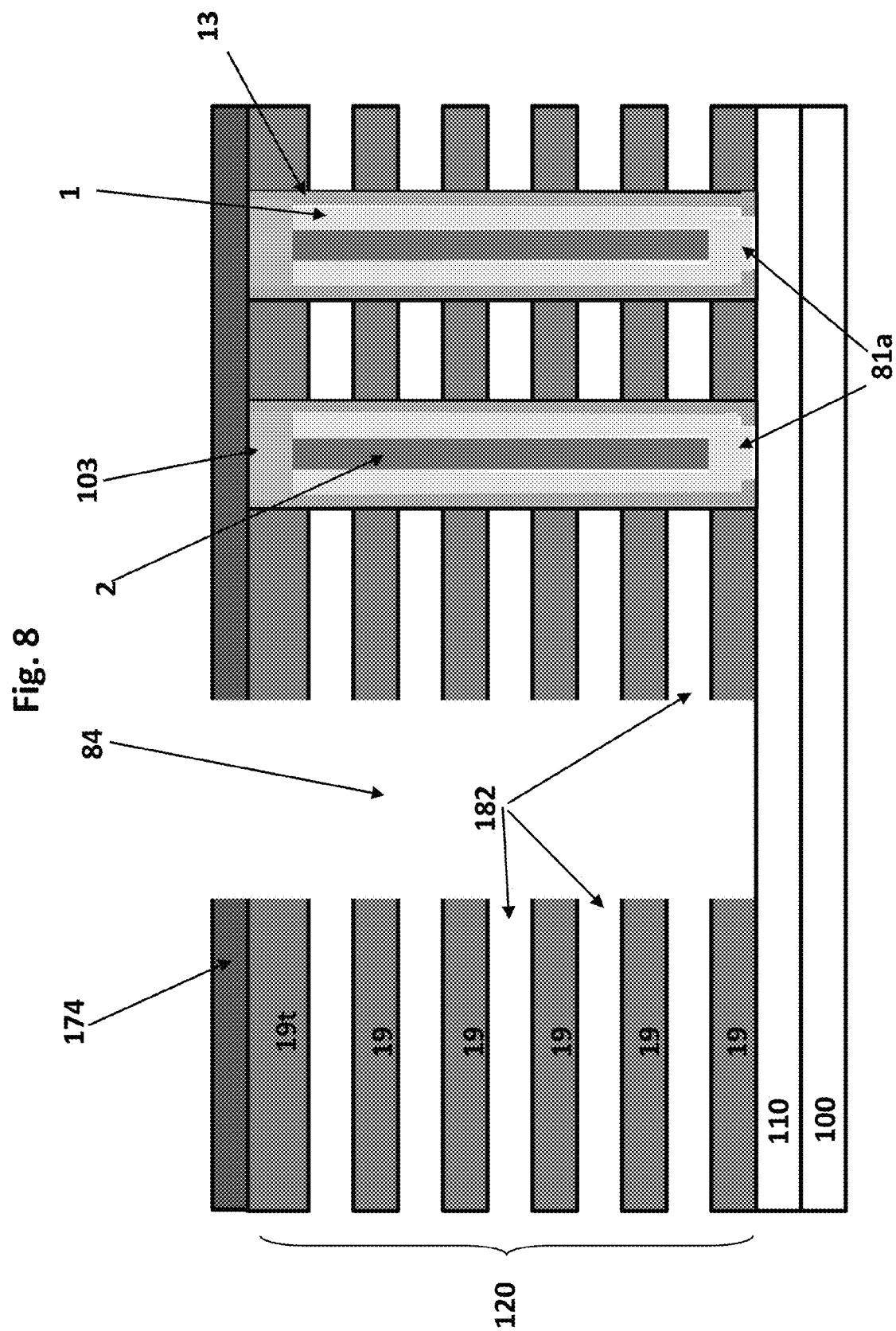
Figure 15:
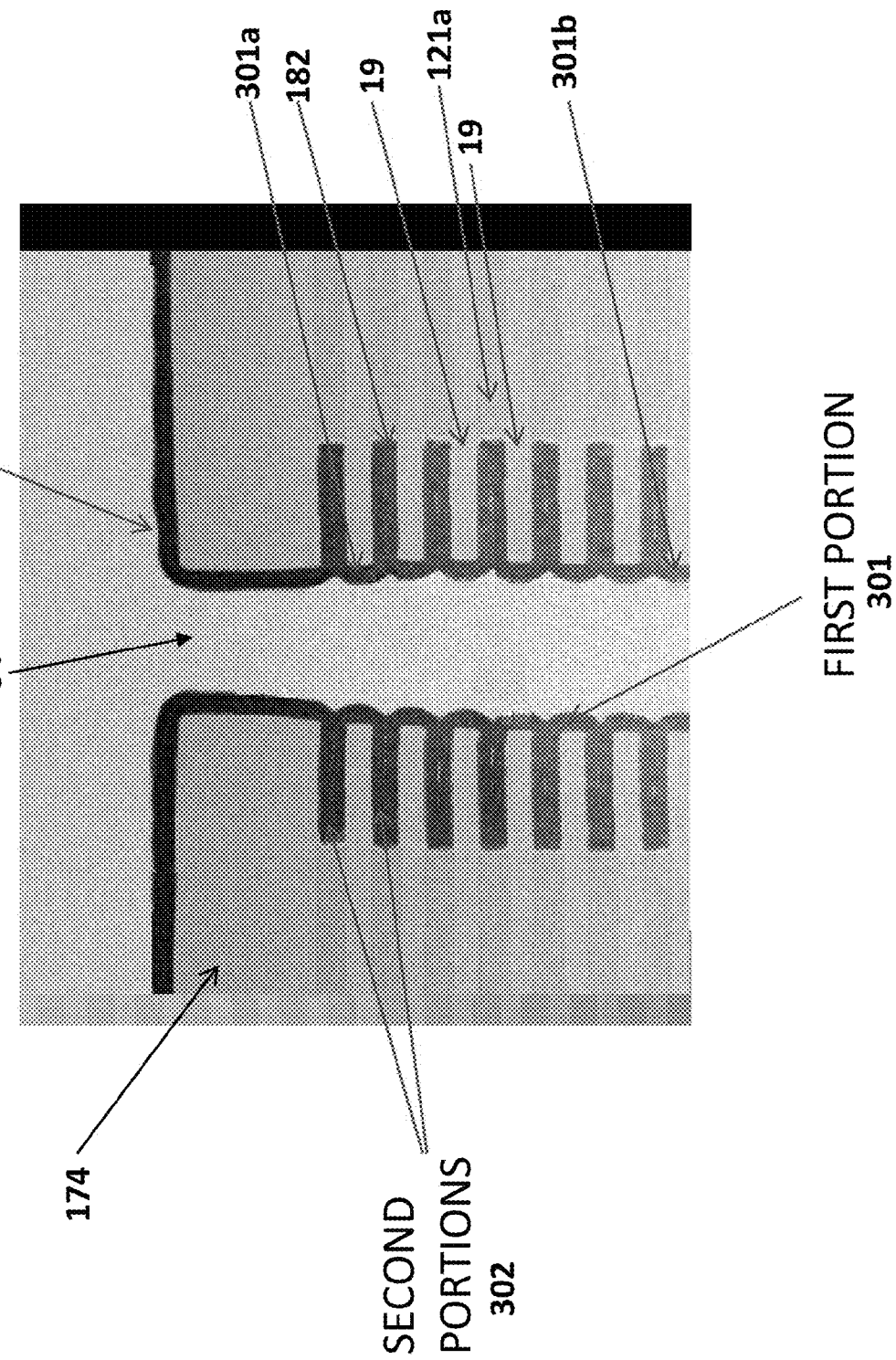
FIG. 15 is a transmission electron micrograph of a portion of a NAND string according to an embodiment.

Then, at least a portion of the sacrificial second material layers 121 are selectively removed through the back side openings 84 selectively etching the silicon nitride layers 121 to form back side recesses 182 between the first material layers 19, as shown in FIG. 8. Layers 121 may be fully removed as shown in FIG. 8. Alternatively, layers 121 may be partially removed as shown in FIG. 15 such that the recesses 182 terminate at the remaining portions of respective layers 121. For example, layers 121 may be removed by selective etching, such as a silicon nitride selective etching which removes silicon nitride layers 121 but does not remove the silicon oxide layers 174, 19 or the silicon regions. The selective etch may stop on the oxide blocking dielectric, such as a silicon oxide blocking dielectric 7 which forms the outer part of the memory film 13.

Alternatively, the blocking dielectric 7 may be formed from the back side in the back side recesses prior to the control gate electrodes 3. In this embodiment, forming the blocking dielectric layer 7 comprises forming the blocking dielectric layer 7 in the back side opening 84 and in the back side recesses 182.

If desired, the at least one charge storage region 9 may be formed through either the front side opening 81 or the back side opening 84. Thus, the step of forming the at least one charge storage region 9 comprises at least one of forming the at least one charge storage region 9 prior to forming the blocking dielectric 7 in the back side opening 84 or forming the at least one charge storage region 9 over the blocking dielectric 7 in the front side opening 81 or over the sidewall in the front side opening 81 (if the blocking dielectric 7 is formed through the back side opening 84).

Figure 9:
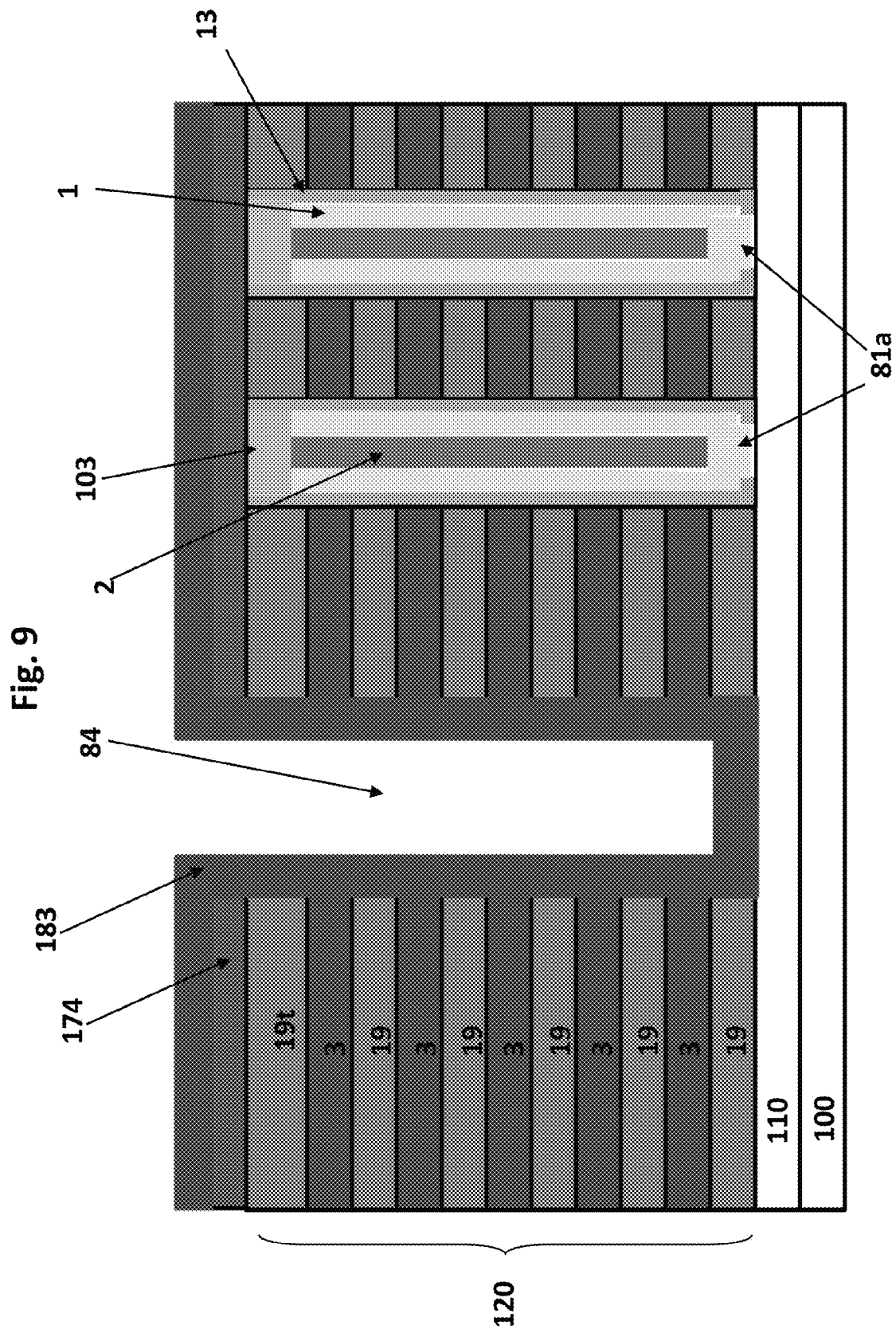

Ruthenium control gate electrodes 3 are then formed in the back side recesses 182 through the back side openings 84, as shown in FIG. 9. In an embodiment, the ruthenium is formed by atomic layer deposition without forming a conductive barrier or nucleation layer in the back side recesses 182. In an embodiment shown in FIG. 9 where the silicon nitride layers 121 are completely removed, the ruthenium layer is formed in contact with the blocking dielectric 7. A portion 183 of the ruthenium control gate material partially or fully fills the back side openings (e.g., trenches) 84 and is located over layer 174. If the blocking dielectric layer 7 is formed the back side recesses 182 through the back side opening 84, then the control gate electrodes 3 are formed over the blocking dielectric layer 7 in the back side recesses 182.

The ruthenium control gate material is may be deposited by atomic layer deposition (ALD). The ruthenium material may be formed by supplying a volatile ruthenium precursor, such as $RuO_4$. One or more $RuO_2$ monolayers may be formed using atomic layer deposition. The one or more $RuO_2$ monolayers may be exposed to a reducing atmosphere to fully or partially reduce the deposited one or more $RuO_2$ monolayers to one or more Ru monolayers. The $RuO_2$ deposition and Ru reducing steps (i.e., 1 ALD cycle) may be repeated multiple times to form the plurality of control gate electrodes 3. A hydrogen based forming gas, such as 4% hydrogen and 96% nitrogen, may be supplied as the reducing atmosphere for the ruthenium oxide. The atomic layer deposition may be performed by cycling, such as with more than 25 cycles, such as 25-40 cycles, to form continuous strips of Ru.

Thus, in an alternative embodiment illustrated in FIG. 15, the step of selectively removing at least portions of the first material layers 121 comprises selectively partially etching the silicon nitride layers 121 through the back side opening 84 to form the recesses 182 containing remaining portions 121a of the silicon nitride layers 121 adjacent to the blocking dielectric. In this embodiment, the step of forming the ruthenium layer comprises selectively forming thicker portions of the ruthenium layer in the recesses 182 on the remaining (not selectively etched) portions 121a of the silicon nitride layers than in the back side opening 84 on edge portions of the silicon oxide layers 19. The thicker portions of the control gates 3 contacting the portions 121a of the silicon nitride layers may be 10 to 100% thicker, such as 50 to 80% thicker, that those contacting the oxide layer 19.

Figure 10:
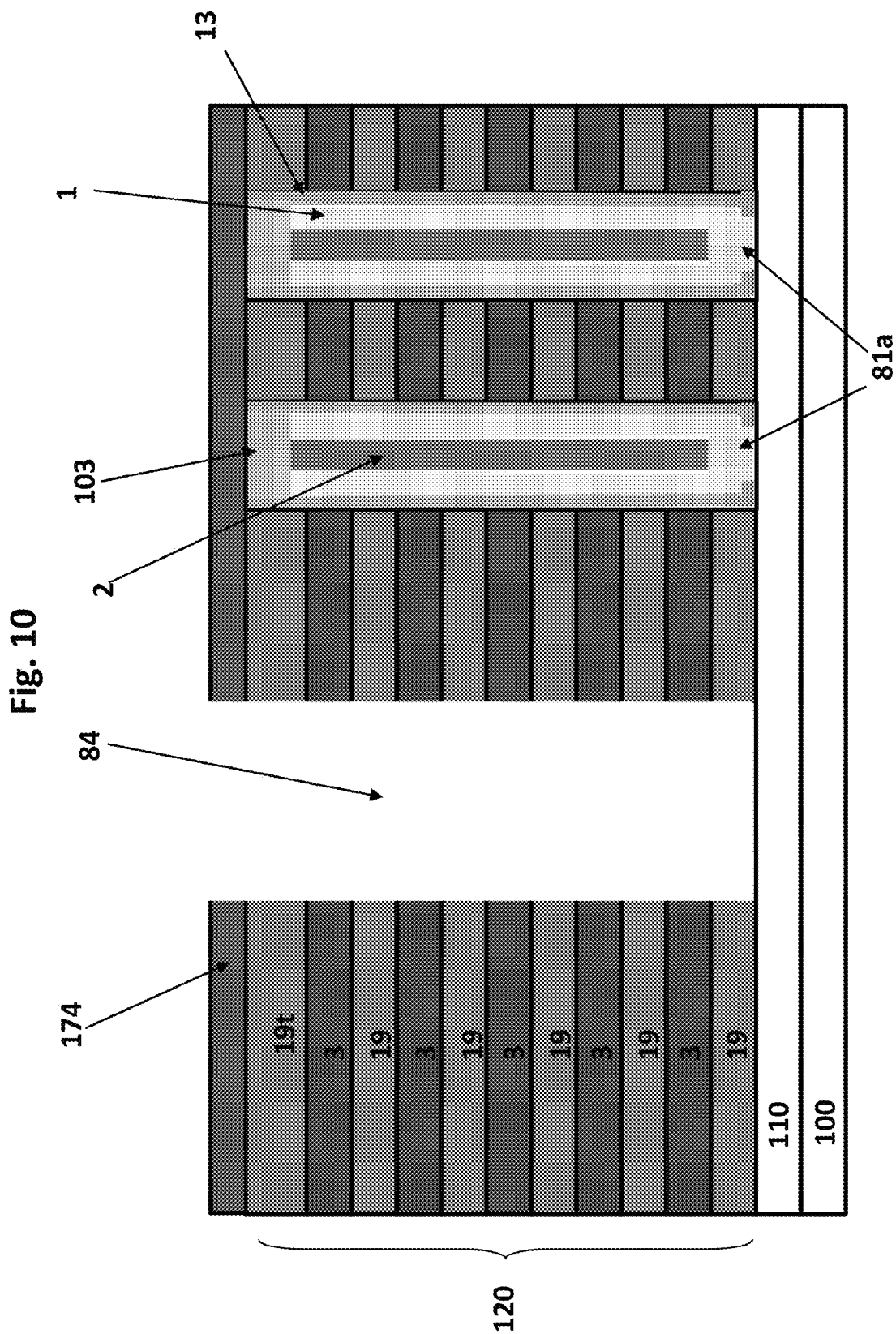

Then, as shown in FIG. 10, the portion 183 of the ruthenium control gate material is removed by anisotropic etching from the back side openings (e.g., trenches) 84 and from over layer 174 without removing the control gate electrodes 3 to complete the formation of the control gate electrodes 3. In an embodiment, the step of removing the portion 183 of the ruthenium control gate material from the back side opening 84 comprises anisotropically etching portions of the ruthenium layer located over the stack and in the back side opening 84 using an etching medium comprising oxygen plasma or a combination of oxygen plasma and halogen gas (e.g., $CF_4$, $Cl_2$, etc.). The ruthenium select gate electrodes (not shown in FIG. 10 for clarity) may be formed above and below the control gate electrodes 3 at the same time or during a different step.

Figure 11:
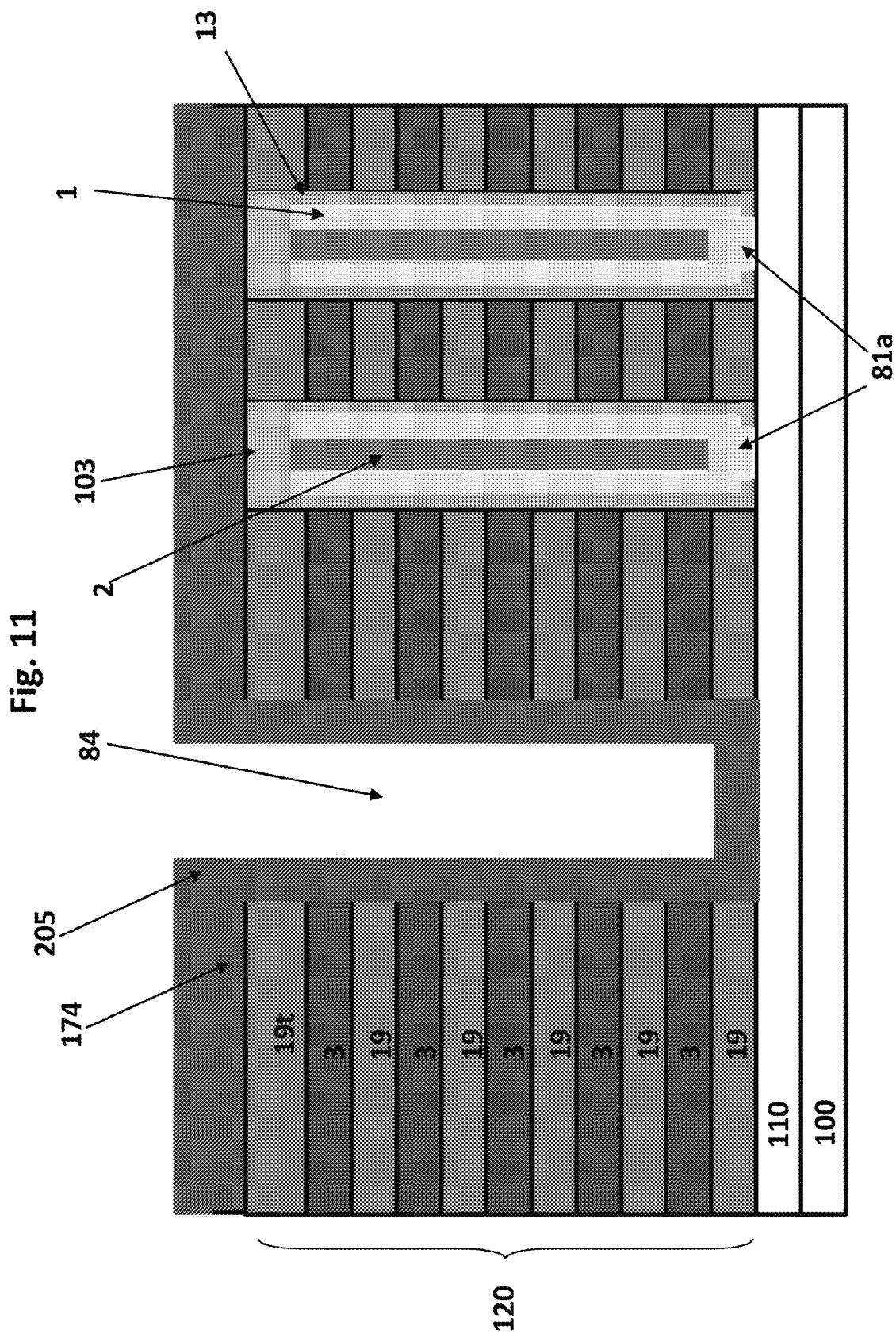
Figure 12:
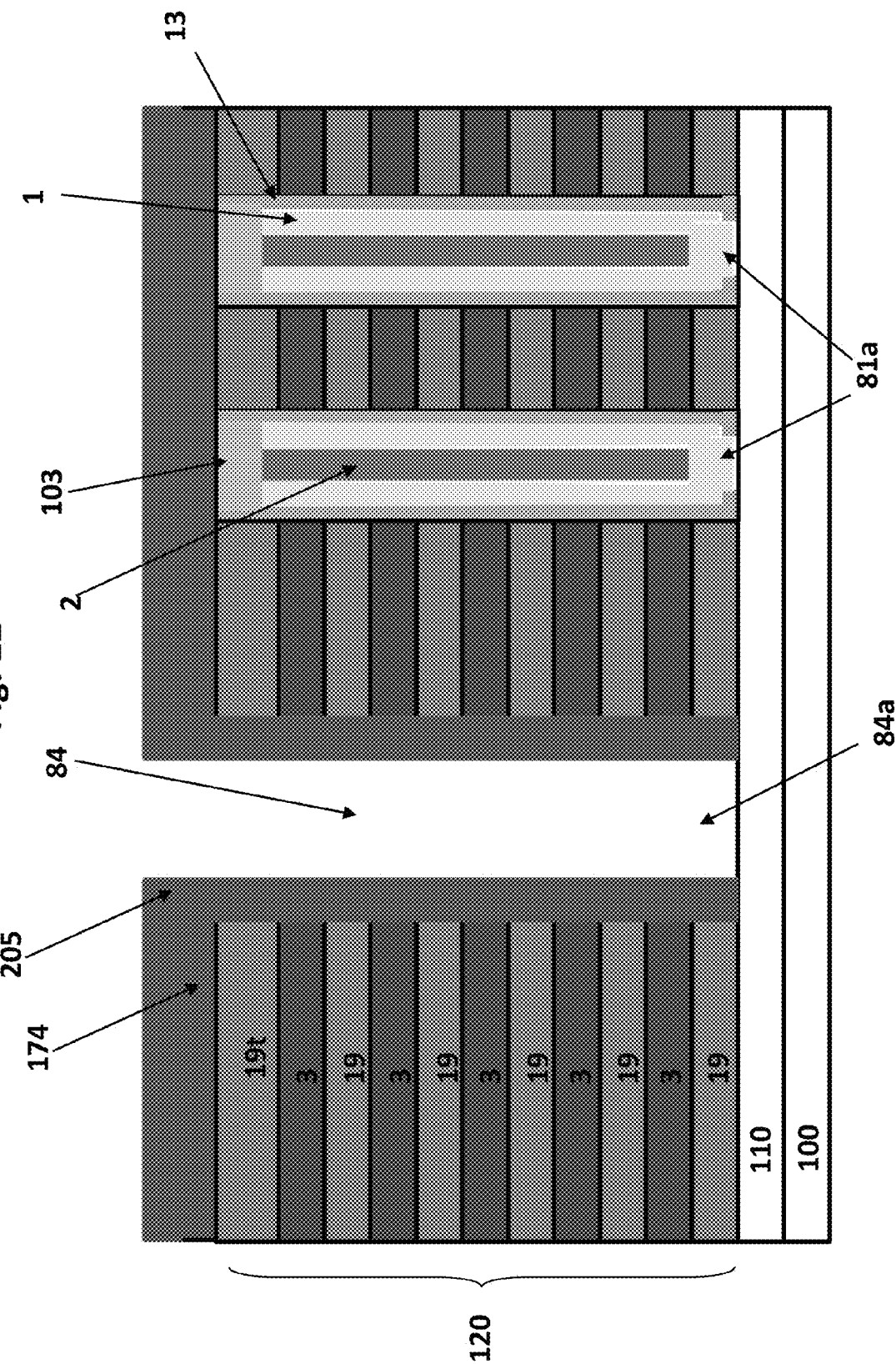

An insulating layer 205, such as a silicon oxide layer, is formed on sidewalls and bottom of the back side trenches 84, as shown in FIG. 11. Layer 205 is also formed over layer 174. The insulating layer 205 is then removed from the bottom 84a of the back side trench 84 by anisotropic etching (e.g., by RIE spacer etch) without removing the insulating layer from the sidewalls of the trench 84, as shown in FIG. 12. This etching step exposes p-well 110 through the bottom 84a of the trench 84.

Figure 13:
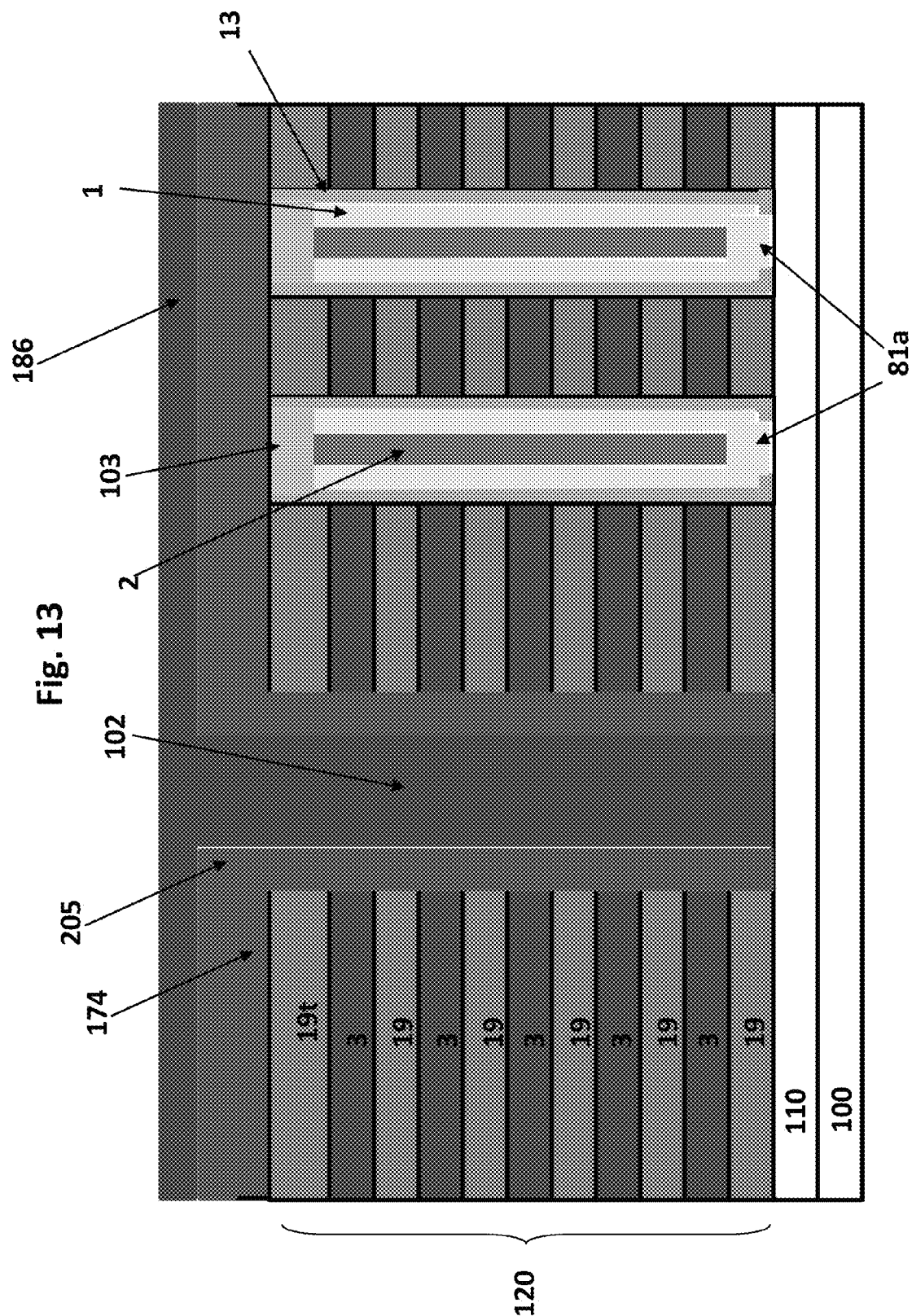
Figure 14:
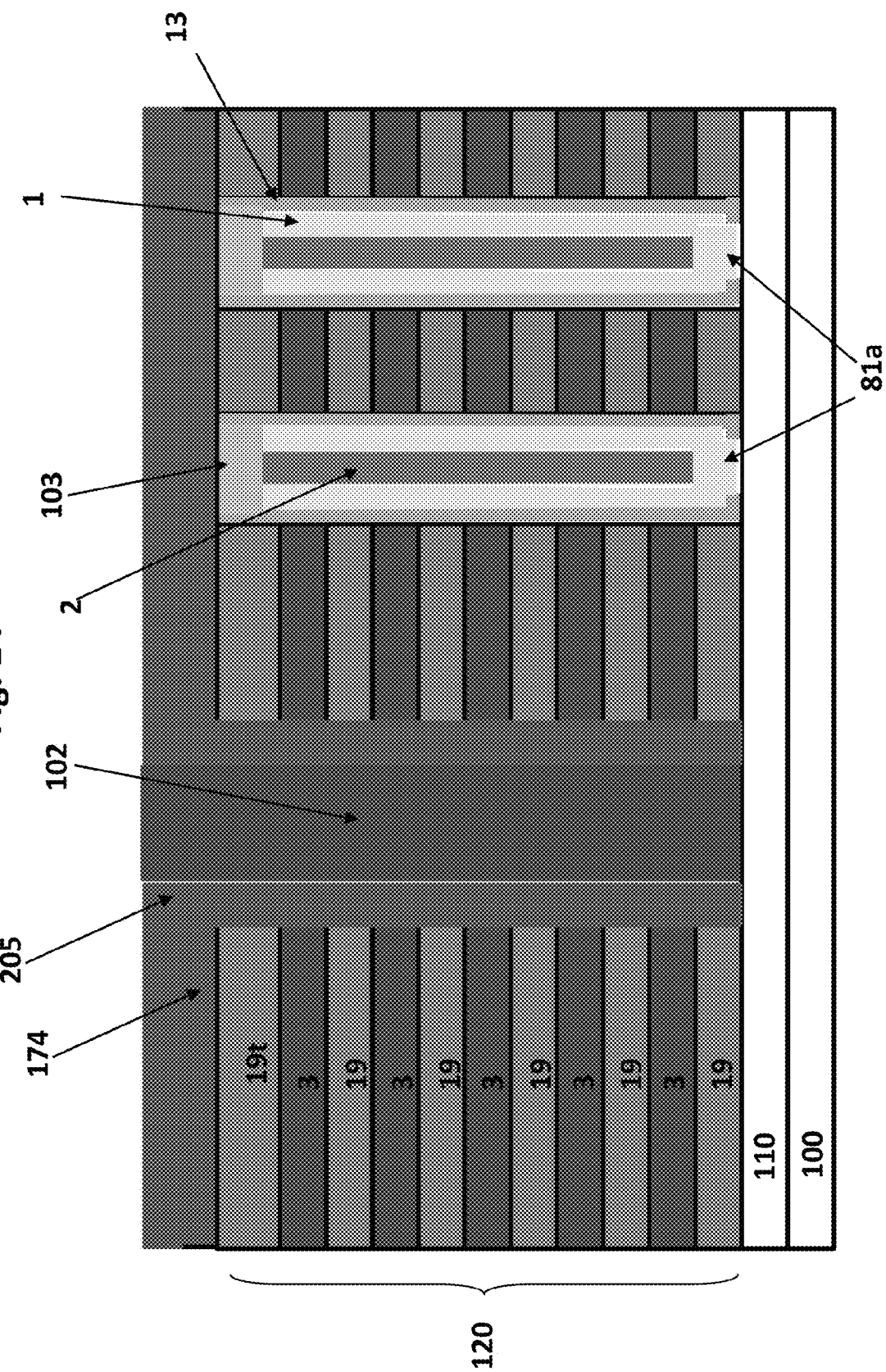

The source electrode 102 is then formed in the back side trench 84 in contact with the source region in the p-well 110 in the substrate 100, as shown in FIG. 13. The source electrode 102 may be formed by depositing ruthenium over layer 205 in the trenches 84, such as by using the above described ALD process. A portion 186 of the source electrode material located over the device is removed by CMP or etching to leave the source electrode 102 in the dielectrically insulated trenches 84, as shown in FIG. 14.

FIG. 15 is a transmission electron micrograph of a portion of a NAND string according to an embodiment. As illustrated in FIG. 15, a first portion 301 of the ruthenium control gate material is located in the back side opening 84 on the exposed surface of the insulating layers 19 in the stack 120. A second portion 302 of the ruthenium control gate material is located in the back side recesses 182 between adjacent insulating layers 19 in the stack 120. A third, overburden portion 303 of the ruthenium control gate material is located over the cover layer 174.

In an embodiment, the first portion 301 of the ruthenium layer located in the back side opening 84 has a thickness of 10 to 40 nm, the second portions 302 of the ruthenium layer located in the back side recesses 84 have a thickness of 10 to 30 nm and the third overburden portion 303 of the ruthenium layer located over the upper, cover layer 174 of the stack 120 has a thickness of less than 80 nm, such as 20-40 nm, such as 20-30 nm. The thin overburden portion 303 results in a lower amount of stress imposed to the other layers of the device and the substrate than that imposed by a tungsten layer with a thicker overburden portion.

The ruthenium layer has a step coverage of greater than 90%, such as 95 to 110%. The step coverage is a ratio of the ruthenium film thickness on a given area and the topmost horizontal or field area.

The ruthenium thickness in the upper and lower portions of the back side opening 84 is substantially uniform. For example, a thickness of an upper part 301a of first portion 301 of the ruthenium layer located in an upper 10% of the back side opening 84 differs by less than 20% (e.g., 0-10%) from a thickness of a lower part 301b of first portion 301 of the ruthenium layer located in a lower 10% of the back side opening 84.

Figures 16A, 16B:
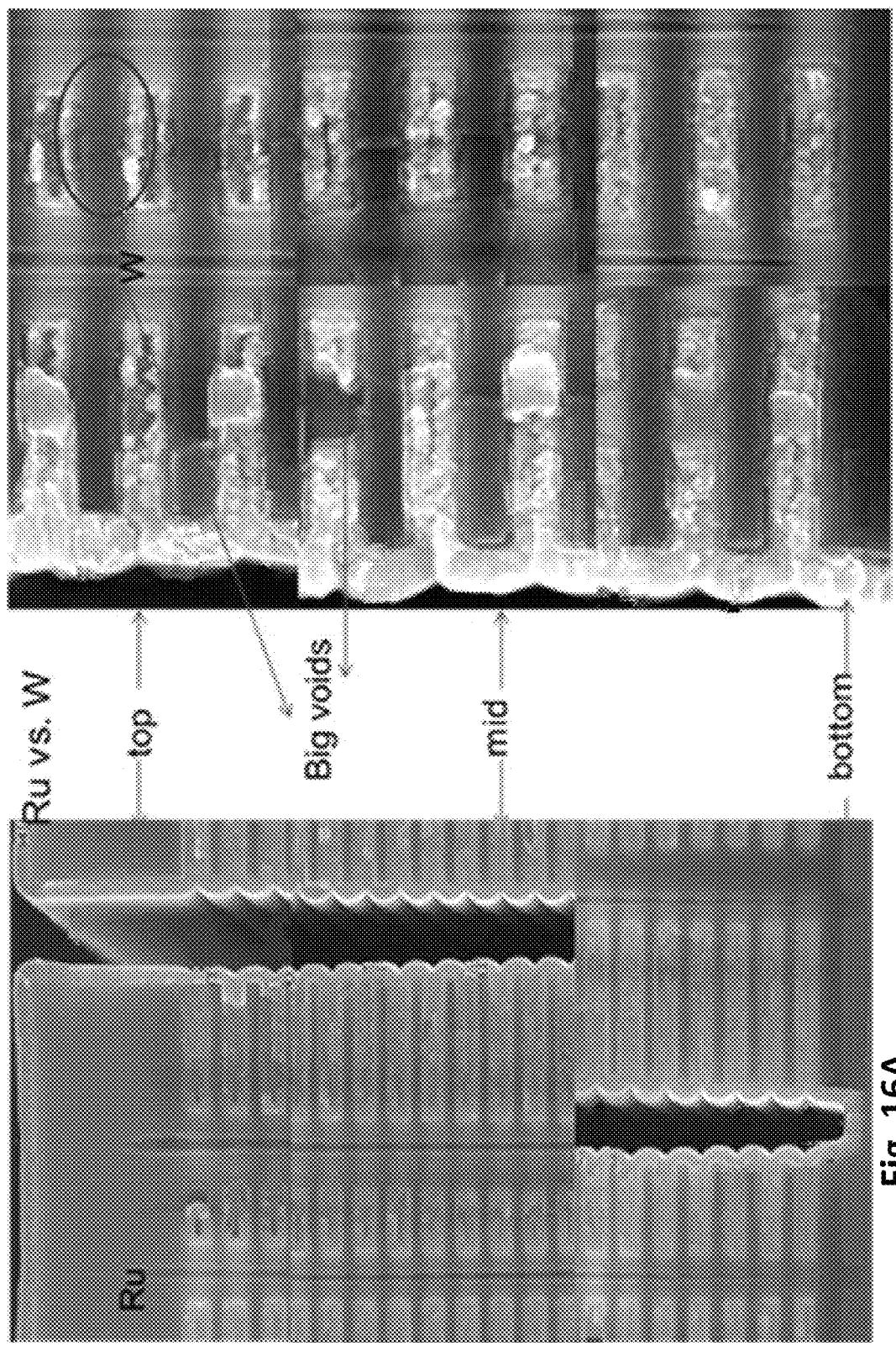
FIGS. 16A and 16B are scanning electron micrographs comparing microstructure of ALD grown ruthenium control gate electrodes with CVD grown tungsten control gate electrodes.

FIGS. 16A and 16B are scanning electron micrographs comparing the microstructure of ALD grown ruthenium control gate electrodes with low temperature CVD grown tungsten control gate electrodes. As can be seen in the micrographs, the ALD ruthenium has better fill properties than CVD tungsten. The ruthenium ALD process results in smoother, more uniform films. In contrast, the tungsten control gate electrodes include large voids. Additionally, there is a much smaller difference in ruthenium layer thickness than tungsten layer thickness formed on the sidewalls in the back side opening between the bottom and the top of the stack. The thickness of the tungsten layer on the sidewalls in the back side opening in the bottom of the stack is more than double the thickness on the sidewalls on the top of the stack.

FIGS. 17A and 17B are scanning electron micrographs comparing the microstructure of ALD grown ruthenium control gate electrodes with incubation delayed CVD grown tungsten control gate electrodes. The incubation delayed CVD process is a CVD process that includes multiple deposition steps in addition to forming adhesion and nucleation layers. The multiple deposition process results in better fill characteristics than the conventional CVD process. However, the incubation delayed CVD process still produces larger voids than the ruthenium ALD process. Further, the incubation delayed CVD process still has a larger variability in fill from top to bottom in the stack.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. All of the publications, patent applications and patents cited herein are incorporated herein by reference in their entirety.

What is claimed is:

1. A method of making a monolithic three dimensional NAND string, comprising:
   forming a stack of alternating layers of a first material and a second material different from the first material over a substrate;
   etching the stack to form at least one opening in the stack;
   forming at least one charge storage region over a sidewall of the at least one opening;
   forming a tunnel dielectric layer over the at least one charge storage region in the at least one opening;
   forming a semiconductor channel material over the tunnel dielectric layer in the at least one opening;
   selectively removing at least portions of the second material layers to form recesses between adjacent first material layers; and
   forming ruthenium control gate electrodes in the recesses.

2. The method of claim 1, further comprising forming a blocking dielectric between the control gate electrodes and the charge storage material layer.

3. The method of claim 2, wherein:
   the at least one opening comprises a front side opening and a back side opening;
   the step of forming the tunnel dielectric layer comprises forming the tunnel dielectric layer in the front side opening;
   the step of forming the semiconductor channel material comprises forming the semiconductor channel material over the tunnel dielectric layer in the front side opening;
   the step of forming the at least one charge storage region comprises forming the at least one charge storage region in the front side opening or in the recesses through the back side opening;
   the step of selectively removing at least portions of the first material layers comprises selectively partially or fully etching the first material layers through the back side opening to form the recesses;
   the step of forming the blocking dielectric comprises forming the blocking dielectric in the front side opening or in the recesses through the back side opening;
   the step of forming the ruthenium control gate electrodes comprises forming a ruthenium layer in the recesses and in the back side opening followed by removing the ruthenium layer from the back side opening to leave the ruthenium control gate electrodes in the recesses.

4. The method of claim 3, wherein the at least one charge storage region comprises a plurality of floating gates or a charge storage dielectric layer formed in the front side opening.

5. The method of claim 3, wherein forming the ruthenium layer comprises forming the ruthenium layer by atomic layer deposition without forming a conductive barrier or nucleation layer in the recesses.

6. The method of claim 5, wherein:
   the step of forming the blocking dielectric comprises forming the blocking dielectric in the recesses through the back side opening;
   the blocking dielectric comprises a metal oxide blocking dielectric; and
   the ruthenium layer is formed in contact with the blocking dielectric in the recesses without forming the conductive barrier or nucleation layer in the recesses.

7. The method of claim 5, wherein:
   the first material layers comprise silicon oxide layers;
   the second material layers comprise silicon nitride layers;
   the step of forming the blocking dielectric comprises forming the blocking dielectric in the front side opening;
   the step of selectively removing at least portions of the first material layers comprises selectively partially etching the silicon nitride layers through the back side opening to form the recesses containing remaining portions of the silicon nitride layers adjacent to the blocking dielectric; and
   the step of forming the ruthenium layer comprises selectively forming thicker portions of the ruthenium layer in the recesses on the remaining portions of the silicon nitride layers than in the back side opening on edge portions of the silicon oxide layers.

8. The method of claim 5, wherein forming the ruthenium layer by atomic layer deposition comprises:
   (a) using a $RuO_4$ precursor to deposit one or more $RuO_2$ monolayers using atomic layer deposition;
   (b) exposing the one or more $RuO_2$ monolayers to a reducing atmosphere to reduce the deposited one or more $RuO_2$ monolayers to one or more Ru monolayers; and
   (c) repeating steps (a) and (b) a plurality of times to form the ruthenium layer.

9. The method of claim 8, wherein:
   a first portion of the ruthenium layer located in the back side opening has a thickness of 10 to 40 nm, second portions of the ruthenium layer located in the recesses have a thickness of 10 to 30 nm, and a third overburden portion of the ruthenium layer located over the upper layer of the stack has a thickness of less than 80 nm;
   the ruthenium layer has a step coverage of greater than 90%; and
   a thickness of an upper part of first portion of the ruthenium layer located in an upper 10% of the back side opening differs by less than 20% from a thickness of a lower part of first portion of the ruthenium layer located in a lower 10% of the back side opening.

10. The method of claim 8, wherein:
    the step of forming the ruthenium layer by atomic layer deposition further comprises annealing the ruthenium layer using rapid thermal annealing at a temperature between 900 and 1000 C; and
    the step of removing the ruthenium layer from the back side opening comprises anisotropically etching portions of the ruthenium layer located over the stack and in the back side opening using an etching medium comprising oxygen plasma or a combination of oxygen plasma and halogen gas.

11. The method of claim 3, further comprising:
    forming a source region of the NAND string in or over the substrate through the back side opening;
    forming an insulating layer in the back side opening;
    removing a bottom portion of the insulating layer to expose the source region; and
    forming a ruthenium source line in the back side opening in contact with the source region.

12. The method of claim 1, wherein:
    the semiconductor channel material comprises polysilicon or amorphous silicon;
    the first material comprises a nitride; and
    the second material comprises an oxide or polysilicon.

13. The method of claim 1, wherein:
    the substrate comprises a silicon substrate;
    the monolithic three dimensional NAND string is located in an array of monolithic three dimensional NAND strings over the silicon substrate;
    the control gate electrodes comprise at least a first control gate electrode located in a first device level and a second control gate electrode located in a second device level located over the major surface of the substrate and below the first device level;

at least one memory cell in the first device level of the three dimensional array of NAND strings is located over another memory cell in the second device level of the three dimensional array of NAND strings; and the silicon substrate contains an integrated circuit comprising a driver circuit for the memory device located thereon.

14. A monolithic three dimensional NAND string, comprising:

a semiconductor channel, at least one end portion of the semiconductor channel extending substantially perpendicular to a major surface of a substrate;

a plurality of ruthenium control gate electrodes extending substantially parallel to the major surface of the substrate, wherein the plurality of control gate electrodes comprise at least a first control gate electrode located in a first device level and a second control gate electrode located in a second device level located over the major surface of the substrate and below the first device level;

a blocking dielectric located in contact with the plurality of ruthenium control gate electrodes;

at least one charge storage region located in contact with the blocking dielectric;

a tunnel dielectric located between the at least one charge storage region and the semiconductor channel;

a source region located in or over the substrate; and a ruthenium source line in contact with the source region.

15. The NAND string of claim 14, wherein the blocking dielectric comprises a plurality of metal oxide clam shaped regions and the plurality of ruthenium control gate electrodes are located in respective openings in respective metal oxide clam shaped regions.

16. The NAND string of claim 14, wherein there is no conductive barrier or nucleation layer located between each ruthenium control gate electrode and the blocking dielectric.

17. The NAND string of claim 14, wherein the at least one charge storage region comprises a plurality of floating gates or a charge storage dielectric layer.

18. The NAND string of claim 14, wherein:

the plurality of ruthenium control gate electrodes are separated from each other by insulating layers; and the at least one end portion of the semiconductor channel comprises a solid silicon rod portion or a hollow silicon cylinder portion that is filled with an insulating fill material.

19. The NAND string of claim 18, wherein the semiconductor channel further comprises a second portion which is located in or over the major surface of the substrate and which extends parallel to the major surface of the substrate between the source region and the at least one end portion.

20. The NAND string of claim 14, wherein:

the substrate comprises a silicon substrate;

the monolithic three dimensional NAND string is located in an array of monolithic three dimensional NAND strings over the silicon substrate;

the ruthenium control gate electrodes comprise at least a first control gate electrode located in a first device level and a second control gate electrode located in a second device level located over the major surface of the substrate and below the first device level;

at least one memory cell in the first device level of the three dimensional array of NAND strings is located over another memory cell in the second device level of the three dimensional array of NAND strings; and the silicon substrate contains an integrated circuit comprising a driver circuit for the memory device located thereon.

* * * * *